(12) United States Patent
Aichi

(10) Patent No.: US 9,018,631 B2
(45) Date of Patent: Apr. 28, 2015

(54) SEMICONDUCTOR DEVICE AND DISPLAY DEVICE EQUIPPED WITH SAME

(75) Inventor: Hiroshi Aichi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/703,248

(22) PCT Filed: Jun. 14, 2011

(86) PCT No.: PCT/JP2011/063559
§ 371 (c)(1),
(2), (4) Date: Dec. 10, 2012

(87) PCT Pub. No.: WO2011/158816
PCT Pub. Date: Dec. 22, 2011

(65) Prior Publication Data
US 2013/0082267 A1  Apr. 4, 2013

(30) Foreign Application Priority Data
Jun. 15, 2010  (JP) ................................. 2010-136251

(51) Int. Cl.
*H01L 29/786* (2006.01)
*H01L 27/12* (2006.01)
*H01L 27/144* (2006.01)

(52) U.S. Cl.
CPC .......... *H01L 29/786* (2013.01); *H01L 27/1214* (2013.01); *H01L 27/1446* (2013.01)

(58) Field of Classification Search
CPC ............ H01L 27/1214; H01L 27/1251; H01L 27/3265
USPC .................. 257/59; 345/175; 438/34
See application file for complete search history.

(56) References Cited

U.S. PATENT DOCUMENTS

| 5,614,730 | A | * | 3/1997 | Nakazawa et al. | ............... 257/59 |
| 8,314,782 | B2 | * | 11/2012 | Ino et al. | ........................ 345/175 |
| 2006/0131580 | A1 | * | 6/2006 | Yang et al. | ...................... 257/59 |
| 2007/0152217 | A1 | * | 7/2007 | Lai et al. | .......................... 257/59 |
| 2009/0141224 | A1 | | 6/2009 | Ito et al. | |
| 2010/0065851 | A1 | * | 3/2010 | Makita | ............................. 257/72 |
| 2011/0227878 | A1 | | 9/2011 | Makita | |

FOREIGN PATENT DOCUMENTS

| JP | H6-275807 A | 9/1994 |
| JP | 2001-215517 A | 8/2001 |
| JP | 2004-253630 A | 9/2004 |

(Continued)

*Primary Examiner* — Yu-Hsi D Sun
*Assistant Examiner* — Christina Sylvia
(74) *Attorney, Agent, or Firm* — Chen Yoshimura LLP

(57) ABSTRACT

Disclosed is a semiconductor device 1000 including a substrate 1, a thin film diode 100 that is supported by the substrate 1 and has a first semiconductor layer 10 having a light-receiving region 10*i*, a thin film transistor 200 that is supported by the substrate 1 and has a second semiconductor layer 20, and a metal layer 22*a* that has an inclined surface 23 that is inclined to the surface of the substrate 1, in which the thin film diode 100 can detect light that enters the light-receiving region 10*i* and has a prescribed wavelength, in which both the first semiconductor layer 10 and the second semiconductor layer 20 are composed of the same semiconductor film, and in which the inclined surface 23 of the metal layer 22*a* faces at least a part of the side faces 3R and 3L of the first semiconductor layer 10. This constitution enables an increase in the amount of light absorbed by the thin film diode and an improvement in the effective light reception sensitivity of an optical sensor part.

13 Claims, 16 Drawing Sheets

(56) References Cited

FOREIGN PATENT DOCUMENTS

| | | |
|---|---|---|
| JP | 2005-275644 A | 10/2005 |
| JP | 2009-135188 A | 6/2009 |
| JP | 2009-237286 A | 10/2009 |
| WO | 2008/132862 A1 | 11/2008 |
| WO | 2010/058532 A1 | 5/2010 |

* cited by examiner (a)

(b)

(c)

(d)

(a)

(b)

(a)

(b)

(a)

(b)

(a)

Incident Angle β of Light Entering Panel [°]

(b)

Taper Angle θ of Metal Layer [°]

SEMICONDUCTOR DEVICE AND DISPLAY DEVICE EQUIPPED WITH SAME

TECHNICAL FIELD

The present invention relates to a semiconductor device that includes a thin film diode (TFD) and a display device equipped with the same.

BACKGROUND ART

In recent years, development of electronic devices such as display devices, image sensors, and the like provided with a photosensor part that uses a TFD has been in progress.

Patent Document 1 discloses an image sensor in which a photosensor part that uses a TFD and a driver circuit that uses a thin film transistor (TFT) are provided on the same substrate. Patent Document 2 discloses a display device provided with an optical touch panel. This display device can detect that an object such as a finger is in contact with a display surface using external light by providing photosensor parts that use TFDs in a display region of a liquid crystal display device. Patent Document 3 discloses a display device provided with an optical touch panel that detects that an object such as a finger is in contact with a display surface by using not only external light incident upon the display panel, but also reflected light initially radiated from a backlight. Patent Document 4 proposes a display device provided with an optical touch panel that uses a sensor that detects invisible light such as infrared light in order to conduct sensing using invisible light emitted from a backlight.

In display devices and image sensors such as those described above, a TFD semiconductor layer and a TFT semiconductor layer are preferably formed using the same semiconductor film. In order to achieve desired TFT characteristics, it is preferable that a crystalline semiconductor film be used for the semiconductor film, and for example, a low temperature polysilicon film is used. The thickness of the low temperature polysilicon film is approximately 20 to 70 nm, for example. In such a case, because the TFD semiconductor layer (low temperature polysilicon layer) is thin, the TFD semiconductor layer cannot absorb a sufficient amount of relatively long wavelength light (infrared light, for example), which means that there is a possibility that a high sensitivity cannot be attained. For example, when attempting to absorb substantially all of the infrared light with a wavelength of 850 nm, the thickness of the TFD semiconductor layer needs to be approximately 10 µm to 20 µm.

However, when making the semiconductor layer made of low temperature polysilicon thicker, there is a possibility that productivity is reduced because the crystallization process such as laser crystallization conducted on an amorphous silicon film requires longer time.

In particular, when conducting crystallization of the amorphous silicon film using a catalyst element, it is difficult to make the crystalline silicon film thick as stated above. In this crystallization process, after the amorphous silicon film with a catalyst element added thereto undergoes solid-phase crystallization through annealing, for example, a laser is radiated onto the crystallized film, thus further increasing the crystalline quality thereof. In order to obtain a crystalline silicon film with excellent crystalline qualities in the crystallization by annealing and the subsequent laser irradiation step, it is necessary to keep the thickness of the crystalline silicon film at no greater than approximately 50 nm, for example.

Thus, in the past, it was difficult to achieve desired TFT characteristics while ensuring the desired sensitivity of photosensors that use TFDs when a TFT and a TFD were formed using the same semiconductor film.

To address this problem, Patent Document 5 proposes a display device provided with a reflective material layer between a TFD semiconductor layer and a substrate. In the display device of Patent Document 5, a concavity is formed in a region of a substrate surface where a TFD is to be formed. A reflective material layer is formed along this concavity and a TFD semiconductor layer is disposed above the reflective material layer with an insulating film therebetween. With this configuration, light reflected by the reflective material layer can be guided onto the TFD semiconductor layer, and thus, the sensitivity (effective sensitivity) of the TFD to long wavelength light can be improved.

RELATED ART DOCUMENTS

Patent Documents

Patent Document 1: Japanese Patent Application Laid-Open Publication No. H6-275807
Patent Document 2: WO 2008/132862
Patent Document 3: Japanese Patent Application Laid-Open Publication No. 2009-237286
Patent Document 4: Japanese Patent Application Laid-Open Publication No. 2005-275644
Patent Document 5: Japanese Patent Application Laid-Open Publication No. 2009-135188

SUMMARY OF THE INVENTION

Problems to be Solved by the Invention

However, even with the configuration proposed in Patent Document 5, there is a possibility that the amount of light absorbed by the TFD semiconductor layer cannot be increased to a sufficient degree. In particular, when emitting light that includes the infrared spectrum from a backlight (referred to as an "IR backlight"), and using the infrared light for sensing, even if reflection by the reflective material layer is used, the amount of infrared light absorbed by the TFD semiconductor layer is small, which means that high sensing capabilities cannot be realized.

The present invention takes into consideration the above-mentioned problems, and an object thereof is to increase the amount of light absorbed by thin film diodes and increase the effective sensitivity of the photosensor part to received light in a semiconductor device provided with a photosensor part that includes a thin film diode, and a thin film transistor on the same substrate.

Means for Solving the Problems

A semiconductor device of the present invention includes: a substrate; a thin film diode supported by the substrate and having a first semiconductor layer that includes a light-receiving region; a thin film transistor supported by the substrate and having a second semiconductor layer; and a metal layer having an inclined surface that is inclined relative to a surface of the substrate, wherein the thin film diode can detect light of a prescribed wavelength incident upon the light-receiving region, wherein the first semiconductor layer and the second semiconductor layer are formed of the same semiconductor film, and wherein at least a portion of a side face of the first semiconductor layer faces the inclined surface of the metal layer.

In a preferred embodiment, the above-mentioned semiconductor device further includes: an insulating film formed between the side face of the first semiconductor layer and the inclined surface of the metal layer; and a pair of insulating films formed so as to be in contact with an upper surface and a lower surface, respectively, of the insulating film between the side face of the first semiconductor layer and the inclined surface of the metal layer, wherein the refractive index of each of the pair of insulating films to the light of the prescribed wavelength is lower than the refractive index of the insulating film to the light of the prescribed wavelength.

In a preferred embodiment, the thickness of the insulating film is at least ½ and at most 2 times as thick as the first semiconductor layer.

In a preferred embodiment, the above-mentioned semiconductor device includes: an additional pair of insulating films formed so as to be in contact with an upper surface and a lower surface, respectively, of the first semiconductor layer, wherein the refractive index of each of the additional pair of insulating films to the light of the prescribed wavelength is lower than the refractive index of the first semiconductor layer to the light of the prescribed wavelength.

In a preferred embodiment, the thin film transistor further includes a gate insulating film that covers the second semiconductor layer, and a gate electrode provided on the gate insulating film, and the metal layer is formed of the same film as the gate electrode.

The gate insulating film does not need to be formed between the inclined surface of the metal layer and the substrate.

In a preferred embodiment, the part of the side face of the first semiconductor layer that faces the inclined surface of the metal layer is not covered by the gate insulating film.

In a preferred embodiment, the first semiconductor layer has a p-type region, an n-type region, and an intrinsic region that is located between the p-type region and the n-type region and is to be the light-receiving region, and at least portions of a side face of the p-type region and a side face of the n-type region face the inclined surface of the metal layer.

In a preferred embodiment, the first semiconductor layer has a p-type region, an n-type region, and an intrinsic region that is formed between the p-type region and the n-type region and is to be the light-receiving region, and at least a portion of the side face of the intrinsic region faces the inclined surface of the metal layer.

The light of the prescribed wavelength may include infrared light.

The above-mentioned semiconductor device may further include a light-shielding layer formed between the thin film diode and the substrate.

The reflectance of the metal layer to the light of the prescribed wavelength may be at least 70%.

A display device of the present invention includes: the above-mentioned semiconductor device; a plurality of pixels arranged in two dimensions; and a plurality of photosensor parts, wherein each of the plurality of photosensor parts includes the thin film diode, and is disposed corresponding to each of the plurality of pixels or a set constituted of two or more pixels, and wherein each of the plurality of pixels includes the thin film transistor.

The above-mentioned display device may further include a backlight that emits the light of the prescribed wavelength.

Effects of the Invention

According to the present invention, in a semiconductor device provided with a photosensor part that includes a thin film diode and a thin film transistor on the same substrate, light reflected by the inclined surface of the metal layer can be made incident upon the semiconductor layer of the thin film diode. As a result, it is possible to increase the intensity of the light incident upon the thin film diode. Also, the light reflected off of the inclined surface of the metal layer enters the semiconductor layer from a side face of the semiconductor layer of the thin film diode and is transmitted towards the in-plane direction of the semiconductor layer, and thus, the light path in the semiconductor layer is longer than when the light is radiated from the perpendicular direction. Therefore, it is possible to increase the amount of light absorbed by the semiconductor layer of the thin film diode, thus increasing the effective sensitivity of the photosensor.

In particular, it is possible to reliably increase the effective sensitivity of the photosensor part to infrared light when conducting sensing using infrared light.

Also, according to the present invention, it is possible to manufacture the above-mentioned semiconductor device with ease without increasing the number of manufacturing steps or manufacturing cost, and so as to be more compact, higher performance, and lower cost.

BRIEF DESCRIPTION OF THE DRAWINGS

FIGS. 1(*b*) and 1(*c*) are each a plan view that shows an example of how the thin film diode and the metal layer are arranged. FIG. 1(*d*) is a cross-sectional view of a thin film diode.

FIG. 2(*a*) shows a case in which the metallic layer 22*a* does not have a tapered part, FIG. 2(*b*) shows a case in which the metallic layer 22*a* has a tapered part (at an angle of 60°), and FIG. 2(*c*) shows a case in which the metallic layer 22*a* has a tapered part (at an angle of 30°). FIG. 2(*d*) is a schematic magnified cross-sectional view for describing the direction from which light enters the insulating film 17.

FIG. 7(*b*) is a graph that shows the results of calculating the sensitivity of a diode in case 2.

FIG. 8(*b*) is a graph that shows the results of calculating the sensitivity of a diode in case 3.

DETAILED DESCRIPTION OF EMBODIMENTS (Embodiment 1)

Figure 1:
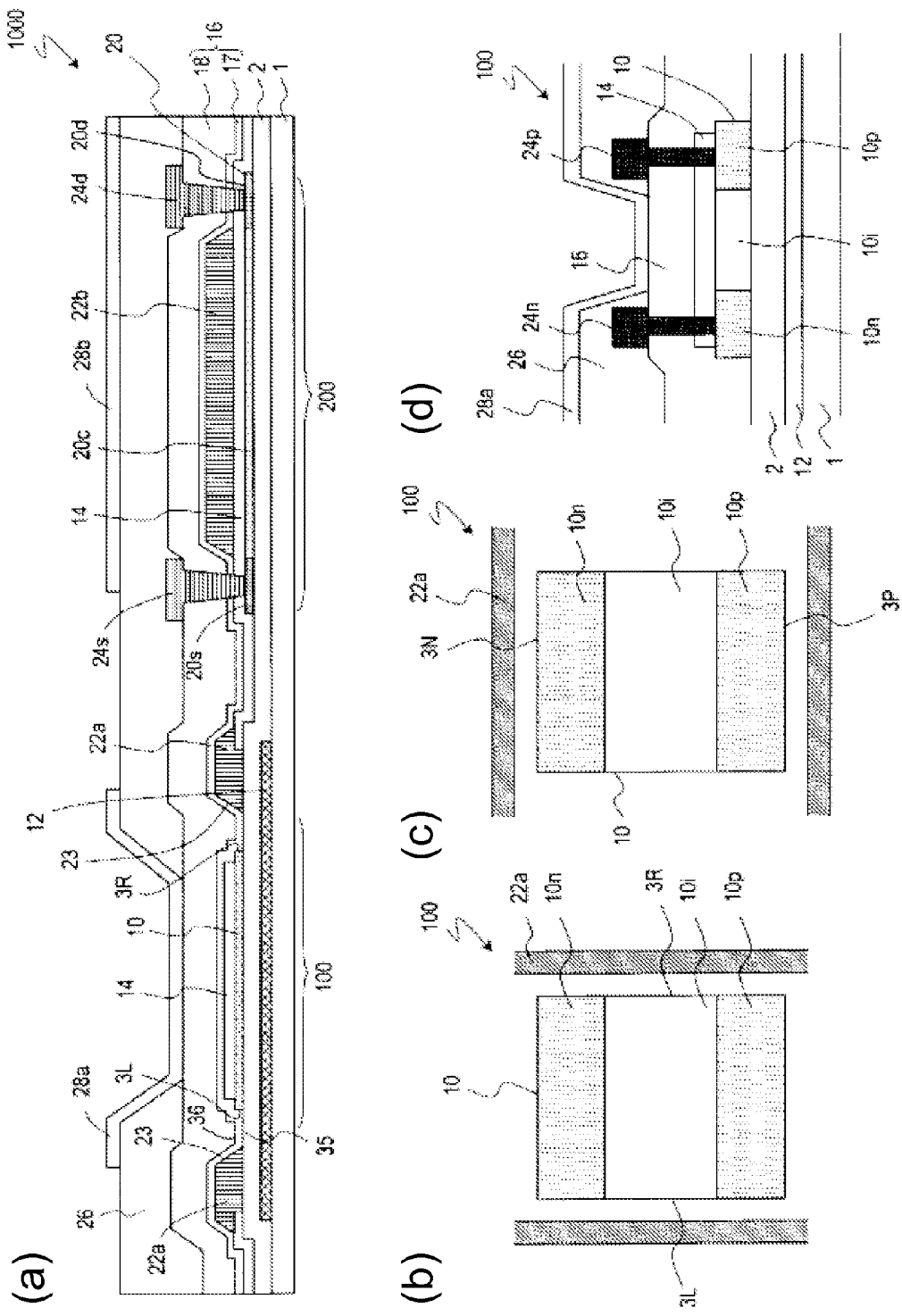
FIG. 1(*a*) is a schematic cross-sectional view of a thin film diode and a thin film transistor of Embodiment 1 according to the present invention.

Embodiment 1 of a semiconductor device of the present invention will be described below. The semiconductor device of the present embodiment is a liquid crystal display device having a photosensor part using a thin film diode and a thin film transistor, for example.

FIG. 1(a) is a schematic cross-sectional view that shows a thin film diode 100 and a thin film transistor 200 in a semiconductor device 1000 of the present embodiment. FIGS. 1(b) and 1(c) are schematic plan views that show examples of configurations of the thin film diode 100. FIG. 1(d) is a schematic cross-sectional view of the thin film diode 100.

As shown in FIG. 1(a), the semiconductor device 1000 is provided with a substrate 1, a photosensor part including the thin film diode 100 formed on the substrate 1, and the thin film transistor 200. The photosensor part may be disposed in the display region of the liquid crystal display device. The thin film transistor 200 may be a pixel switching TFT disposed at each pixel of the display region, or a driver circuit TFT disposed in a region other than the display region. Alternatively, the thin film transistor 200 may be a TFT that constitutes a circuit used in the photosensor part.

As shown in FIG. 1(d), the thin film diode 100 has a semiconductor layer 10 that includes a p-type region 10p, an n-type region 10n, and an intrinsic region 10i located between the regions 10p and 10n. In the present specification, the "intrinsic region 10i" refers to a region that is located between the p-type region 10p and the n-type region 10n, and that has a lower impurity concentration (thus having a higher resistance) than the regions 10p and 10n. Therefore, the intrinsic region 10i may be a region made of an intrinsic semiconductor, or a region that has a p-type or n-type impurity implanted therein, but at a lower concentration than that of the p-type region 10p or the n-type region 10n.

A gate insulating film 14 and an interlayer insulating film 16 are formed on the semiconductor layer 10. The interlayer insulating film 16 has a layered structure including an insulating film 17 and an insulating film 18. Electrodes 24p and 24n are provided on the interlayer insulating film 16. The electrodes 24p and 24n are respectively connected to the p-type region 10p and the n-type region 10n via contact holes formed in the insulating films 14 and 16.

It is preferable that a light-shielding layer 12 be formed on the substrate 1 side of the semiconductor layer 10 with an insulating film (base coat film) 2 formed between the light-shielding layer 12 and the semiconductor layer 10. In this case, it is preferable that at least the intrinsic region 10i of the semiconductor layer 10 be disposed in a region shielded by the light-shielding layer 12 from light entering from the substrate 1 side. In the present embodiment, the light-shielding layer 12 not only shields the light entering from the rear side of the substrate 1, but also functions as a reflective layer that reflects light incident from above the substrate 1.

Meanwhile, the thin film transistor 200 is provided with a semiconductor layer 20, a gate electrode 22b provided above the semiconductor layer 20 with the gate insulating film 14 therebetween, an interlayer insulating film 16 covering the gate electrode 22b and the semiconductor layer 20, and a source electrode 24s and a drain electrode 24d provided on the interlayer insulating film 16. The semiconductor layer 20 includes a source region 20s, a drain region 20d, and a channel region 20c interposed therebetween. The gate electrode 22b is disposed above the channel region 20c. The source electrode 24s and the drain electrode 24d are respectively connected to the source region 20s and the drain region 20d via contact holes formed in the insulating films 14 and 16.

The semiconductor layer 10 of the thin film diode 100 and the semiconductor layer 20 of the thin film transistor 200 are formed of the same semiconductor film. Thus, the thin film diode 100 and the thin film transistor 200 can be manufactured in the same process.

The semiconductor device 1000 of the present embodiment is further provided with at least one metal layer 22a formed on the substrate 1. As shown in FIG. 1(a), the metal layer 22a includes a tapered part that has an inclined surface 23 that is inclined relative to a normal line of the substrate 1. At least a portion of the side face of the semiconductor layer 10 faces the inclined surface 23 of the metal layer 22a. Here, "a side face of the semiconductor layer 10 faces the inclined surface 23 of the metal layer 22a" means that there exists a plane that is parallel to the substrate 1 (also parallel to the bottom surface of the semiconductor layer 10) and that intersects with both the side face of the semiconductor layer 10 and the inclined surface 23 of the metal layer 22a. Thus, the bottom surface of the semiconductor layer 10 and the bottom surface of the metal layer 22a do not need to be on the same plane. It is preferable that the metal layer 22a and the gate electrode 22b be formed of the same metal film because this allows the manufacturing process to be simplified.

As shown in FIG. 1(b), the metal layer 22a of the present embodiment may extend along the side faces 3R and 3L of the intrinsic region 10i. Alternatively, as shown in FIG. 1(c), the metal layer 22a may extend along the side face 3P of the p-type region 10p and the side face 3N of the n-type region 10n.

In the present embodiment, the height of the bottom surfaces of the semiconductor layer 10 and the metal layer 22a from the substrate surface and the thickness of the semiconductor layer 10 and the metal layer 22a are adjusted such that the inclined surface 23 of the metal layer 22a and the side face of the semiconductor layer 10 face each other.

For example, in the configuration shown in FIG. 1, a gate insulating film 14 is not formed between the tapered part that includes the inclined surface 23 and the substrate 1, and the metal layer 22a is formed in contact with the upper surface of the insulating film 2. Such a configuration is formed as follows. First, the gate insulating film 14 that covers the semiconductor layers 10 and 20 is formed. Next, a portion of the gate insulating film 14 is removed, thus forming an opening, and the metal layer 22a is formed in the opening. At this time, the gate electrode 22b may be formed on the semiconductor layer 20 using the same conductive film as the metal layer 22a. With this configuration, the bottom surface of the metal layer 22a can be made lower than the bottom surface of the gate electrode 22b by an amount corresponding to the thickness of the gate insulating film 14, relative to the surface of the substrate 1. As a result, the side face of the semiconductor layer 10 can face the inclined surface 23 of the metal layer 22a. The area of the side face of the semiconductor layer 10 facing the inclined surface 23 can be made large.

According to the present embodiment, at least a portion of the side face of the semiconductor layer 10 faces the inclined surface 23 of the metal layer 22a, and thus, some of the light that is incident on the inclined surface 23 of the metal layer 22a from above the substrate 1 enters the semiconductor layer 10 after reflecting off of the inclined surface 23. As a result, the light entering the intrinsic region 10i of the semiconductor layer 10 intensifies. Also, the light reflected off of the inclined surface 23 enters the semiconductor layer 10 from the side face thereof and is then transmitted through the semiconductor layer 10 in the in-plane direction, and thus the light path through the semiconductor layer 10 is long. Therefore, the amount of light absorbed by the semiconductor layer 10 can be increased, thus increasing the photocurrent in the thin film diode 100.

In the example shown in the drawing, the light reflected off of the inclined surface 23 travels to the side face 3R of the semiconductor layer 10 with the insulating film 17 as a waveguide layer. Specifically, the light reflected off of the inclined surface 23 travels through the insulating film 17 and reaches a boundary 35 between the insulating film 17 and the insulating film 2 or a boundary 36 between the insulating film 17 and the insulating film 18. If the refractive index of the insulating film 17 to the reflected light is greater than that of the insulating films 18 and 2, which are in contact with the upper and lower surfaces of the insulating film 17, then the reflected light can be completely reflected by the boundaries 35 and 36. In such a case, the reflected light is efficiently transmitted through the insulating film 17, enters the semiconductor layer 10 from the side face 3R of the semiconductor layer 10, and travels through the semiconductor layer 10 in the layer in-plane direction. The light path in the semiconductor layer 10 for light that enters from the side face 3R of the semiconductor layer 10 and travels towards the layer in-plane direction is longer than the light path in the semiconductor layer 10 (thickness×refractive index) for light that enters the semiconductor layer 10 from the normal direction to the layer. Thus, light that enters from the side face 3R of the semiconductor layer 10 is efficiently absorbed by the semiconductor layer 10.

In the examples shown in FIGS. 1(b) and 1(c), the entirety of the side faces 3R and 3L of the intrinsic region 10i or the entirety of the side faces 3P and 3N of the semiconductor layer 10 faces the inclined surface 23 of the metal layer 22a, but if at least a portion of the side faces 3R, 3L, 3P, and 3N faces the inclined surface 23, the above-mentioned effect can be attained. Also, the configuration for disposing the semiconductor layer 10 and the metal layer 22a such that the side face of the semiconductor layer 10 and the inclined surface 23 of the metal layer 22a face each other is not limited to the configuration shown as an example in FIG. 1(a). The height of the bottom surface of the metal layer 22a or the semiconductor layer 10 from the substrate surface can be adjusted for another configuration. It is preferable that the thickness of the metal layer 22a and the semiconductor layer 10 be selected appropriately. Additionally, the metal layer 22a may be formed using a different film from the gate electrode 22b. However, from a manufacturing process perspective, it is preferable that the metal layer 22a be formed of the same metal film as gate wiring lines.

As shown in FIG. 1(a), a protective film 26 made of a transparent resin may be formed so as to cover the thin film diode 100 and the thin film transistor 200. A shield electrode 28a and a pixel electrode 28b are provided on the protective film 26. The shield electrode 28a electrically shields the thin film diode 100 from electrical charges or the like in the substrate surface. Here, the shield electrode 28a and the pixel electrode 28b are formed using the same transparent conductive film (ITO film, for example), but the shield electrode 28a may be formed of a different conductive film from the pixel electrode 28b. Although not shown in drawings, the pixel electrode 28b is connected to drain electrodes of the pixel switching TFTs.

A contact hole may be formed in the part of the protective film 26 above the thin film diode 100 and the shield electrode 28a may be provided in the contact hole. If the protective film 26 above the semiconductor layer 10 is removed in this manner, it is possible to prevent the change over time of the electrical properties of the protective film 26 from affecting the properties of the thin film diode 100. In addition, it is possible to prevent the light entering from above the substrate 1 from being absorbed by the protective film 26 or reflected off of the boundary between the protective film 26 and the interlayer insulating film 16, thus allowing the light from above the substrate 1 to enter the semiconductor layer 10 efficiently. In FIG. 1, only the part of the protective film 26 located above the semiconductor layer 10 is removed, but the part located above the metal layer 22a may also be removed.

The effect of providing the metal layer 22a having the inclined surface 23 is described in detail below with reference to drawings.

Figure 2:
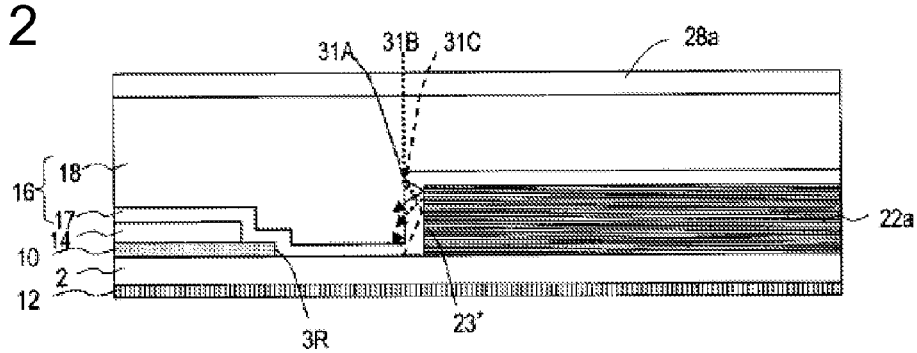
FIGS. 2(*a*) to 2(*c*) are magnified cross-sectional views for describing the light reflected by the inclined surface (side face) of a metal layer 22*a*.
Figure 2:
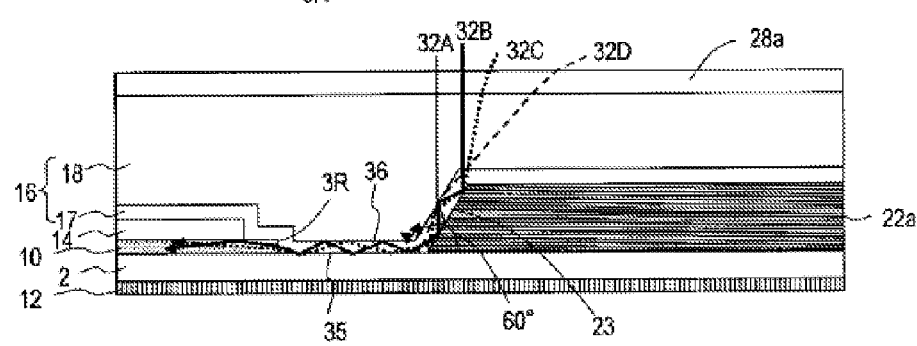
Figure 2:
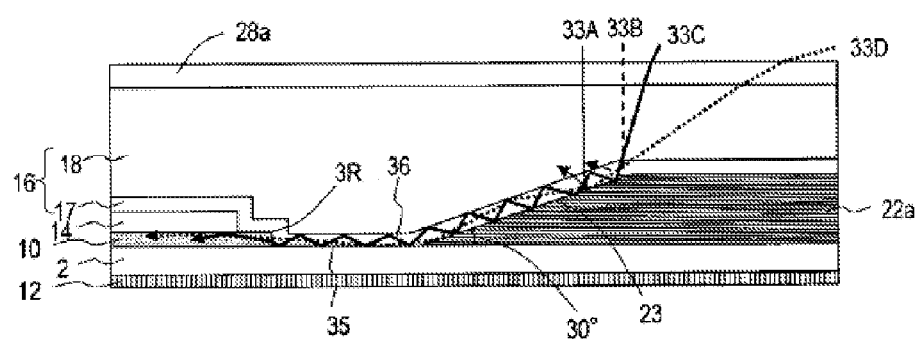
Figure 2:
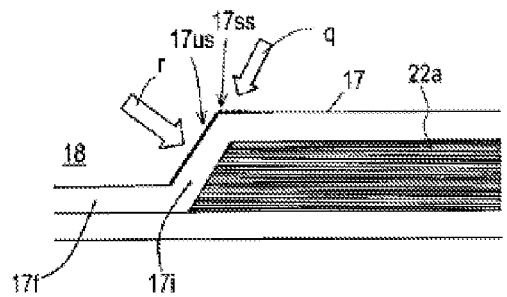

FIGS. 2(a) to 2(c) are magnified cross-sectional views for describing the light reflected by the inclined surface 23 of the metal layer 22a. FIG. 2(a) shows a case in which the metal layer 22a does not have a tapered part, or in other words, a case in which a side face 23' of the metal layer 22a is at a 90° angle to the substrate surface. FIGS. 2(b) and 2(c) show cases in which the metal layer 22a has a tapered part. In FIG. 2(b), the angle of the inclined surface 23 of the metal layer 22a to the metal surface (taper angle) is 60° while the taper angle in FIG. 2(c) is 30°. For simplicity, components in common with FIG. 1 are assigned the same reference characters. Arrows 31A to 31C, 32A to 32D, and 33A to 33D in the drawings all represent light of a wavelength that is detectable by the thin film diode 100. In FIG. 2, a protective film 26 is not shown, but even if a protective film 26 is formed above the metal layer 22a, the light incident on the inclined surface 23 of the metal layer 22a behaves similarly to the light in FIG. 2.

In order to transmit light efficiently through the insulating film 17 to the semiconductor layer 10, it is preferable that the light transmitted through the insulating film 17 is completely reflected at the boundaries between the insulating film 17 and the insulating films 2 and 18. When using an $SiO_2$ film (refractive index: 1.46) for the insulating film 2 and the insulating film 18 and an SiN film (refractive index 2.0) for the insulating film 17, the angle of the light incident upon the boundaries must be at least approximately 47.7° (critical angle) in order for the light being transmitted through the insulating film 17 to be completely reflected off of the boundaries (total reflection condition).

The inventors of the present invention determined based on research that, in the magnified view of FIG. 2(d), it is difficult for light "r" incident upon the insulating film 17 from an upper surface 17us of a part 17i of the insulating film 17 located above the inclined surface 23 (hereinafter referred to as the inclined part) to fulfill the total reflection condition. This is because, while a portion of the light "r" enters the insulating film 17 at an angle of at least 47.7° to the normal line of the inclined surface 23, the light is refracted at the boundary between the insulating film 18 and the insulating film 17, thus not fulfilling the total reflection condition. The inventors of the present invention then studied whether or not light "q" incident upon the insulating film 17 from a side face 17ss in a part of the insulating film 17 located above the inclined surface 23 fulfills the total reflection condition at the inclined part 17i of the insulating film 17. In addition, the inventors of the present invention studied whether or not the portion of the light "q" that fulfills the total reflection condition at the inclined part 17i also fulfills the total reflection condition at a part 17f of the insulating film 17 located between the metal layer 22a and the semiconductor layer 10 (a part located above the insulating film 2; hereinafter referred to as the horizontal part).

First, a case as in FIG. 2(a) will be described in which the metal layer 22a does not have a tapered part. If the angle between the side face 23' of the metal layer 22a and the bottom surface of the metal layer 22a is 90°, the light 31A and 31B radiated from the upper surface 17us (FIG. 2(d)) does not enter the insulating film 17 at an angle that fulfills the total reflection condition due to refraction at the boundary between the insulating film 18 and the insulating film 17. The light 31B enters from the normal direction of the substrate. The light 31C, which enters the insulating film 17 from the side face 17ss (FIG. 2(d)), fulfills the total reflection condition at the part located above the side face 23' of the insulating film 17 (hereinafter referred to as the "vertical part") and is transmitted through the insulating film 17, although this depends on the angle of incidence. However, the light 31C does not fulfill the total reflection condition in the part of the insulating film 17 located between the metal layer 22a and the semiconductor layer 10 (horizontal part). This is because the angle between the vertical part and the horizontal part of the insulating film 17 is approximately 90° due to the taper angle being 90°, which means that it is a logical impossibility for the light to fulfill the total reflection condition (angle of incidence ≥47°) in any of the parts.

Therefore, unless the side face of the metal layer 22a on the side facing the semiconductor layer 10 is inclined, the above-mentioned effect cannot be attained.

By contrast, if, as shown in FIGS. 2(b) and 2(c), the side face 23 of the metal layer 22a on the side facing the semiconductor layer 10 is inclined (inclined surface 23), some of the light that fulfills the total reflection condition in the part of the insulating film 17 located above the inclined surface 23 (inclined part 17i shown in FIG. 2(d)) also fulfills the condition in the horizontal part (horizontal part 17f shown in FIG. 2(d)). Thus, the light can be transmitted through the insulating film 17 to the side face 3R of the semiconductor layer 10 and enter the semiconductor layer 10. The smaller the taper angle is, the smaller the angle formed between the inclined part and the horizontal part of the insulating film 17 is, thus increasing the ease with which the light, which fulfills the total reflection condition in the inclined part, also fulfills the condition in the horizontal part.

Specifically, if the taper angle is 60° as shown in FIG. 2(b), the light 32A entering the insulating film 17 from the upper surface 17us does not enter the insulating film 17 at an angle that fulfills the total reflection condition due to refraction at the boundary between the insulating film 18 and the insulating film 17. Meanwhile, the light 32B, 32C, and 32D entering the insulating film 17 from the side face 17ss fulfills the total reflection condition at the inclined part 17i of the insulating film 17 and can be transmitted through the insulating film 17. Of this, the light 32B, which enters from the substrate normal direction, and the light 32C, which enters from a direction close to the substrate normal direction, also fulfills the total reflection condition at the horizontal part 17f of the insulating film 17, and thus, the light is transmitted through the insulating film 17 to the side face 3R of the semiconductor layer 10. However, the light 32D entering from a greatly inclined direction from the substrate normal direction does not fulfill the total reflection condition at the horizontal part 17f of the insulating film 17, and after being reflected at the boundary 35, the light 32D exits to the insulating film 18 side, passing through the boundary 36.

In addition, as shown in FIG. 2(c), when the taper angle is 30°, the light 33A entering the insulating film 17 from the upper surface 17us does not enter the insulating film 17 at an angle that fulfills the total reflection condition due to refraction at the boundary between the insulating film 18 and the insulating film 17. The light 33B entering from the substrate normal direction is reflected at the inclined surface 23, and then exits to the insulating film 18 side, passing through the boundary 36. Meanwhile, the light 33C and 33D, which are incident upon the side face 17ss of the insulating film 17 from a greatly inclined direction from the substrate normal line, all fulfills the total reflection condition at the inclined part 17i and the horizontal part 17f of the insulating film 17, is transmitted through the insulating film 17, and enters the semiconductor layer 10 from the side face 3R.

In this manner, with a smaller taper angle, the light entering the insulating film 17 more easily fulfills the total reflection condition at both the inclined part 17i and the horizontal part 17f of the insulating film 17. Also, as the taper angle is decreased, it is possible to more efficiently guide light that enters the insulating film 17 from a direction greatly inclined towards the inclined surface 23 relative to the substrate normal line to the semiconductor layer 10. Conversely, as the taper angle is increased, it is possible to more efficiently guide light that enters the insulating film 17 from a direction close to the substrate normal direction to the semiconductor layer 10. Therefore, it is preferable that the taper angle be selected appropriately, taking into consideration the distribution of the angles of incidence of light to the inclined surface 23 and the area of the inclined surface (light receiving area).

For example, if a large proportion of the light incident upon the inclined surface 23 enters from a direction within ±20° of the substrate normal direction and the amount of this light absorbed by the semiconductor layer 10 is to be increased, the taper angle may be increased (40° to 60°, for example). On the other hand, if a large proportion of the light enters from a direction at an angle of 30° or greater to the substrate normal line, then the taper angle may be decreased (30° to 50°, for example).

The angle distribution of incident light depends on the purpose or design of the device, such as the distance between the semiconductor layer 10 and the shield electrode 28a or the directivity of the backlight. In the light sensor touch panel, which is configured such that light reflected off of an object such as a finger on the panel surface is sensed by the thin film diode 100, the amount of light incident upon the inclined surface 23 from the substrate normal direction is minimal. The light reflected off of the panel surface typically enters the inclined surface 23 from a direction inclined from the substrate normal line.

As stated above, according to the present embodiment, it is possible to efficiently guide light incident upon the inclined surface 23 of the metal layer 22a from above the substrate 1 to the side face 3R of the semiconductor device 10 with the insulating film 17 as a waveguide layer, thus increasing the amount of light absorbed by the semiconductor layer 10. The "light entering from above the substrate 1" includes not only the light that enters the display panel from the viewer side of the display panel, but also light from a backlight provided on the rear side of the display panel that is reflected by a finger pad or the like on the display surface of the display panel and that returns to the substrate 1 side.

In the example shown in FIGS. 2(b) and 2(c), the light 32B, 32C, 33C, and 33D reflected by the inclined surface 23 of the metal layer 22a is transmitted towards the semiconductor layer 10 with mainly the insulating film 17 as the waveguide layer. The insulating film that is mainly used as a waveguide layer preferably has a higher refractive index for light at a wavelength to be detected than the insulating films that are in contact with the upper surface and the lower surface of the insulating film used as a waveguide layer (insulating films 2 and 18 in FIG. 2). With this configuration, relying on the total reflection of light due to the difference in refractive index between the films, the loss of light reflected by the inclined surface 23 while being transmitted to the side face 3R of the semiconductor layer 10 can be minimized. Therefore, even if the area of the inclined surface 23 is small, it is possible to attain this effect to a sufficiently high degree. The insulating film mainly used as the waveguide layer needs only to be formed between the inclined surface 23 of the metal layer 22a and the side face 3R of the semiconductor layer 10, in the same plane as the surface 23 and the side face 3R.

The thickness of the insulating film (in this case, the insulating film 17) used mainly as the waveguide layer is preferably at least ½ and at most 2 times as thick as the semiconductor layer 10. If the thickness of the insulating film 17 is less than ½ as much as that of the semiconductor layer 10, the amount of light entering from the side face to the inclined part of the insulating film 17 decreases, thus making difficult a sufficient increase in the amount of light entering the semiconductor layer 10 in some cases. Also, if the thickness of the insulating film 17 is at most 2 times as much as that of the semiconductor layer 10, the light guided to the vicinity of the side face 3R of the semiconductor layer 10 by the insulating film 17 can be efficiently guided to the semiconductor layer 10 from the side face 3R. More preferably, the thickness of the insulating film 17 is less than or equal to that of the semiconductor layer 10. With this configuration, the light guided by the insulating film 17 to the vicinity of the side face 3R of the semiconductor layer 10 can be more effectively guided to the semiconductor layer 10 from the side face 3R. Even more preferably, the thickness of the insulating film 17 is approximately the same as that of the semiconductor layer 10. With this configuration, a sufficient amount of light enters the insulating film 17 and the light that enters the insulating film 17 can be reliably guided to the semiconductor layer 10 from the side face 3R. Thus, the amount of light absorbed by the semiconductor layer 10 can be reliably increased.

Additionally, the refractive index of the semiconductor layer 10 to light of a wavelength to be detected is preferably higher than the refractive index of the insulating films 2 and 18, which are in contact with the upper and lower surfaces thereof, to light of the same wavelength. With this configuration, the light entering the semiconductor layer 10 from the side face 3R of the semiconductor layer 10 is completely reflected at the boundary between the semiconductor layer 10 and the insulating film 2 or the insulating film 18, and thus, the light can be absorbed more reliably by the intrinsic region 10i of the semiconductor layer 10. Therefore, the amount of light absorbed by the intrinsic region 10i can be increased even further.

The metal layer 22a is preferably not transparent to light of a wavelength to be detected by the thin film transistor 100. The reflectivity of the metal layer 22a to light of this wavelength is preferably at least 70%, for example. With this configuration, the intensity of the light entering the side face 3R of the semiconductor layer 10 can be reliably increased. The above-mentioned reflectivity refers to the reflectivity of the metal layer 22a to light that enters from the air.

It is preferable that the side face 3R of the semiconductor layer 10 face the inclined surface 23 in the thickness direction. In other words, it is preferable that planes parallel to the substrate 1 and crossing the side face 3R all intersect with the inclined surface 23. With this configuration, it is possible to efficiently guide light reflected by the inclined surface 23 to the semiconductor layer 10.

The angle between the inclined surface 23 of the metal layer 22a and the surface of the substrate 1 (incline angle) may be greater than 0° and less than 90°, but is preferably at least 30° and at most 80°. If the incline angle (also referred to as the taper angle) exceeds 80°, the light reflected by the inclined surface 23 passes the boundary between the insulating film 17 and the insulating film 18 with greater ease. As a result, it is difficult to guide the light reflected by the inclined surface 23 to the semiconductor layer 10 efficiently. If the incline angle is less than 30°, light from a direction close to the normal line of the substrate 1 enters the inclined surface 23 with more difficulty, and there is a possibility that the intensity of the light entering the semiconductor layer 10 cannot be increased sufficiently. More preferably, the incline angle is between 40° and 70° inclusive. The incline angle of the inclined surface 23 does not need to be constant in the thickness direction of the metal layer 22a. In a case in which the angle is not constant throughout the metal layer 22a, it is preferable that at least a portion of the inclined surface 23 has an incline angle within the above-mentioned range.

It is preferable that, as shown in FIG. 1, the gate insulating film 14 not be formed on the side faces 3R and 3L of the semiconductor layer 10. With this configuration, the light that is reflected by the inclined surface 23 and then transmitted through the insulating film 17 can be guided onto the semiconductor layer 10 more efficiently. Even if not the entire side face of the semiconductor layer 10 is exposed from the gate insulating film 14, it is possible to attain the above-mentioned effects if at least the part of the side face of the semiconductor layer 10 facing the inclined surface 23 of the metal layer 22a is not covered by the gate insulating film 14.

It is preferable that a reflective layer, a light absorbing layer, or the like not be provided between the side face of the semiconductor layer 10 and the inclined surface 23 of the metal layer 22a. Also, while the distance between the side face of the semiconductor layer 10 and the inclined surface 23 of the metal layer 22a (distance in the in-plane direction) is not limited, it is preferable that the distance be at most 2 μm, for example, in order to minimize the loss of light.

Figure 3:
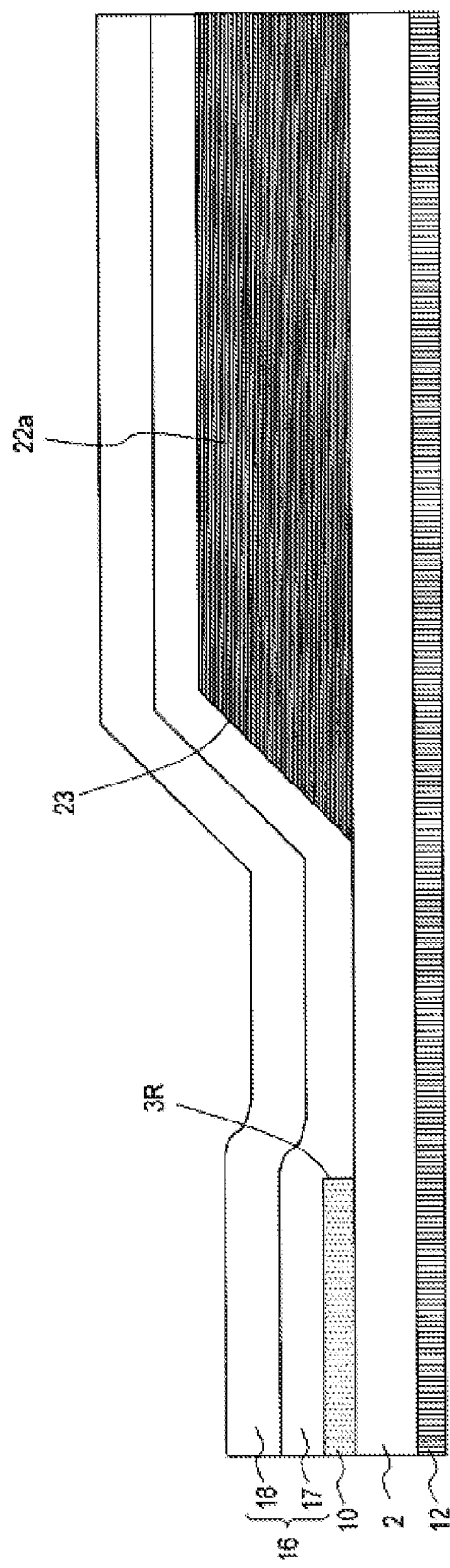
FIG. 3 is a cross-sectional view that shows another thin film diode according to Embodiment 1 of the present invention.

The configuration of the semiconductor device of the present embodiment is not limited to the configuration shown in FIG. 1. FIG. 3 is a cross-sectional view that shows an example of respective parts of another semiconductor device of the present embodiment.

In the semiconductor device 1000 shown in FIG. 1, the gate insulating film 14 is formed so as to cover the semiconductor layer 10, but as shown in FIG. 3, the gate insulating film 14 does not need to be formed on the semiconductor layer 10. In a case in which the insulating film 14 is not formed on the semiconductor layer 10, the refractive index of the semiconductor layer 10 is preferably higher than the refractive indices of the insulating film 17 and the insulating film 2.

<Absorbance of Light and Effective Sensitivity of Thin Film Diode 100>

The sensitivity (effective sensitivity) of the thin film diode 100 of the present embodiment was studied using a simulation and the results thereof will be described. Here, the absorbance and sensitivity of the semiconductor layer 10 to light incident thereon after being radiated onto the tapered part of the metal layer 22a were studied.

FIG. 4(a) is a plan view that shows a diode model used in the simulation. FIG. 4(b) is a cross-sectional view of FIG. 4(a) along the lines Ia-Ia', Ib-Ib', Ic-Ic', and Id-Id' in the plan view of FIG. 4(a). The diode model has a semiconductor layer 10 that includes an intrinsic region 10i, a p-type region 10p, and an n-type region 10n. The semiconductor layer 10 is a polysilicon layer with a thickness of 50 nm. In the plan view, if the direction of current flow is L and the direction perpendicular to L is W, the length of the intrinsic region 10i in the L direction is 6 μm and the W direction length thereof is 10 μm. Also, metal layers M1 having inclined surfaces that face a side face 3P of the p-type region 10p and a side face 3N of the n-type region 10n of the semiconductor layer 10, and metal layers M2 having inclined surfaces that face the side faces 3R and 3L of the intrinsic region 10i are disposed in the periphery of the semiconductor layer 10.

In the simulation, first, the relation between the thickness of the semiconductor layer (Si layer) and the proportion of the light, which enters vertically from above the semiconductor layer, that the intrinsic region absorbs (absorbance) was studied.

The reflectivity R and the transmittance T of a semiconductor layer on a glass substrate were derived for case in which the incident light was visible light (wavelength: 550 nm) and a case in which the incident light was infrared light (wavelength: 850 nm). Light that was neither reflected by nor transmitted through the semiconductor layer was assumed to have been absorbed by the semiconductor layer and the value obtained by subtracting the sum of the reflectivity R and the transmittance T from 100% was designated as the "absorbance (%)" of the Si layer.

Figure 5:
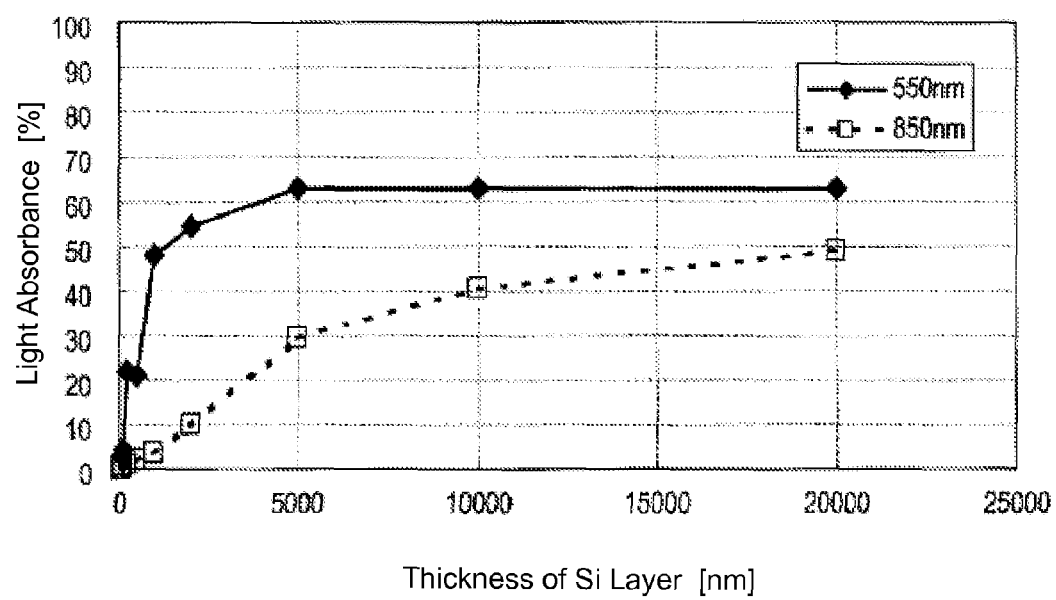
FIG. 5 is a graph that shows the relation between the thickness of a semiconductor layer (polysilicon layer) and the absorbance of visible light and infrared light.

The results are shown in FIG. 5. In the graph shown in FIG. 5, the horizontal axis represents the thickness of the Si layer and the vertical axis represents the absorbance (%) of light of various wavelengths by the Si layer.

From the results shown in FIG. 5, it can be seen that as the thickness of the semiconductor layer increases, the absorbance thereof of light also increases. Also, it can be seen that in order to obtain a desired absorbance, it is necessary to increase the thickness of the semiconductor layer for longer wavelengths of incident light.

Figure 4:
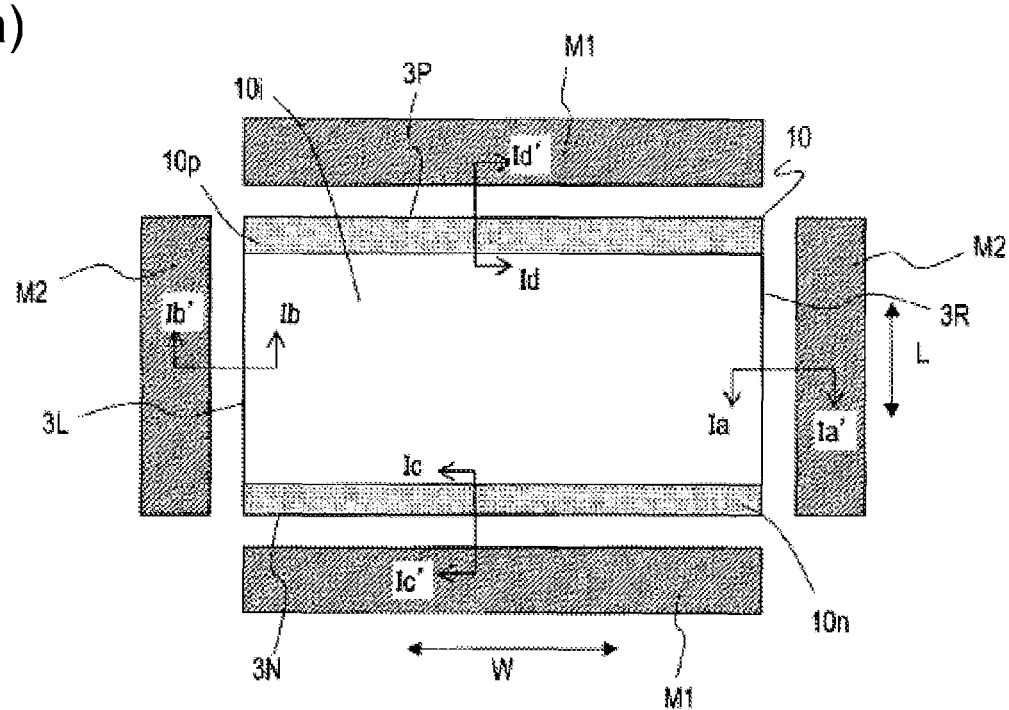
FIGS. 4(*a*) and 4(*b*) are respectively a plan view and a cross-sectional view for describing a diode model used in a simulation.
Figure 4:
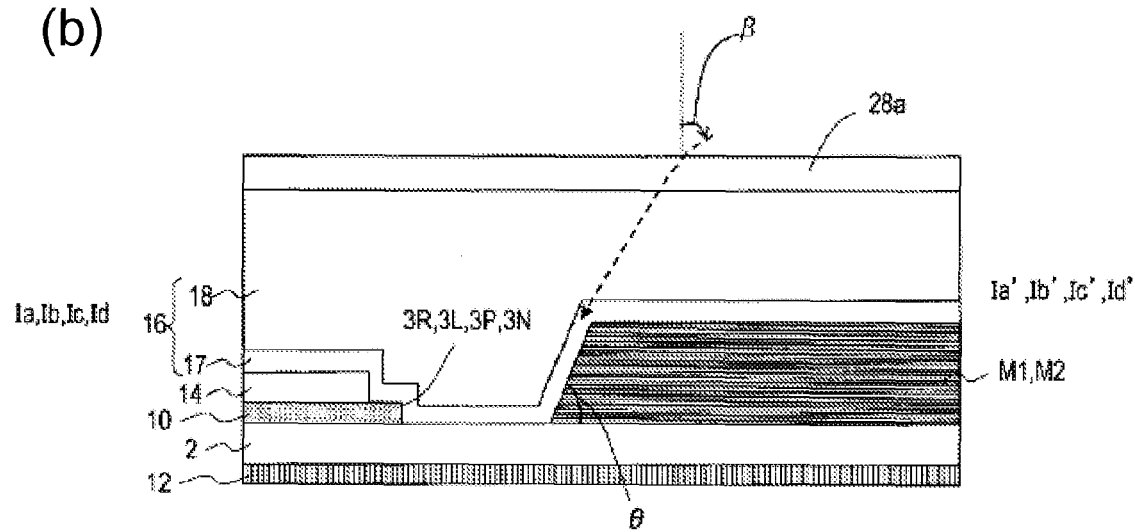

In addition, from these results, it can be seen that in the model shown in FIG. 4, since the semiconductor layer 10 is thin at 50 nm, the absorbance thereof of infrared light incident upon the upper surface of the semiconductor layer 10 is minimal. If the wavelength of the incident light is 850 nm (infrared), then the rate of absorption (absorbance) by the intrinsic region 10i of light incident upon the semiconductor layer 10 from above the substrate in the vertical direction is approximately 0.5%. By contrast, if light (infrared) is incident upon the semiconductor layer 10 from the side faces 3N and 3P of the semiconductor layer 10, for example, because the length of the semiconductor layer 10 (intrinsic region 10i) in relation to the incident light is 6 μm, the proportion of infrared light absorbed in the intrinsic region 10i in the graph shown in FIG. 5 can be seen as the absorbance of infrared light by an Si layer that is 6 μm in thickness, which is approximately 30%. Similarly, when infrared light enters from the side faces 3R and 3L of the semiconductor layer 10, because the length of the semiconductor layer 10 (intrinsic region 10i) in relation to infrared light is 10 μm, the proportion of infrared light absorbed by the intrinsic region 10i is approximately 40%. If light is guided from the side faces of the semiconductor layer 10 in this manner rather than vertically to the semiconductor layer 10, then the absorbance of light can be greatly increased.

Next, the rate of increase in effective sensitivity of the diode resulting from providing the inclined surfaces of the metal layers M1 and the inclined surfaces of the metal layers M2 on the sides of the semiconductor layer 10 will be described. Here, the rate of sensitivity increase due to the inclined surfaces of the pair of metal layers M2 in the W direction cross-section was derived as an example.

The rate of sensitivity increase can change depending on (1) the proportion of components in the light entering through the side face of the inclined part of the insulating film 17, out of the light entering the liquid crystal panel, (2) the proportion of components in the light transmitted through the insulating film 17 and entering the semiconductor layer 10 from the side face, out of the light entering through the side face of the inclined part of the insulating film 17, (3) the proportion of absorption (the absorbance shown in FIG. 5) of light entering the semiconductor layer 10 from the side face by the intrinsic region 10i, and the like.

The proportions of (1) and (2) in particular depend on the distribution of angles of incidence β (hereinafter simply referred to as the "angle distribution") of light incident upon the liquid crystal panel. The angle distribution depends on the structure (thickness of the interlayer insulating film, the directivity of the light from the backlight, and the like) and the purpose of the liquid crystal panel.

Figure 6:
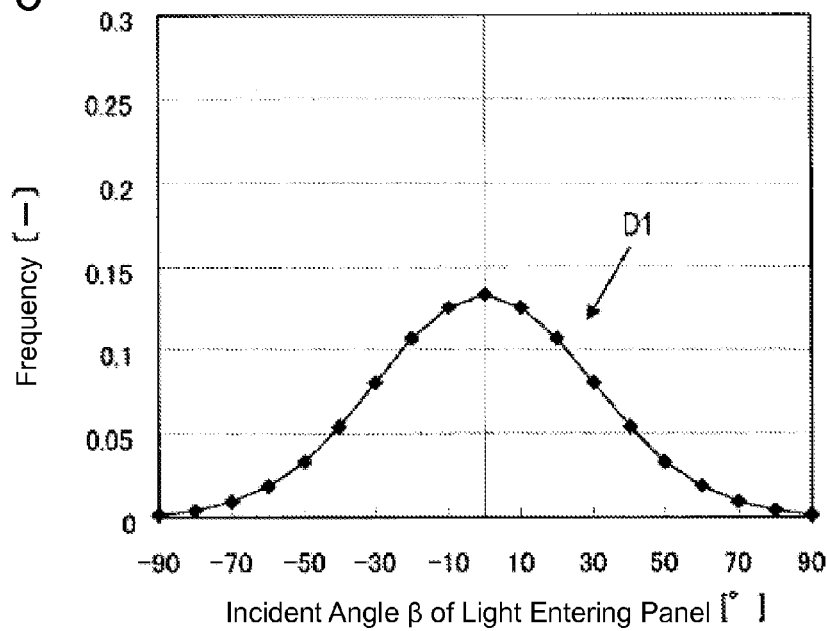
FIG. 6(*a*) is a graph that shows a distribution of angles of incidence β in case 1, and FIG. 6(*b*) is a graph that shows the results of calculating the sensitivity of a diode in case 1.
Figure 6:
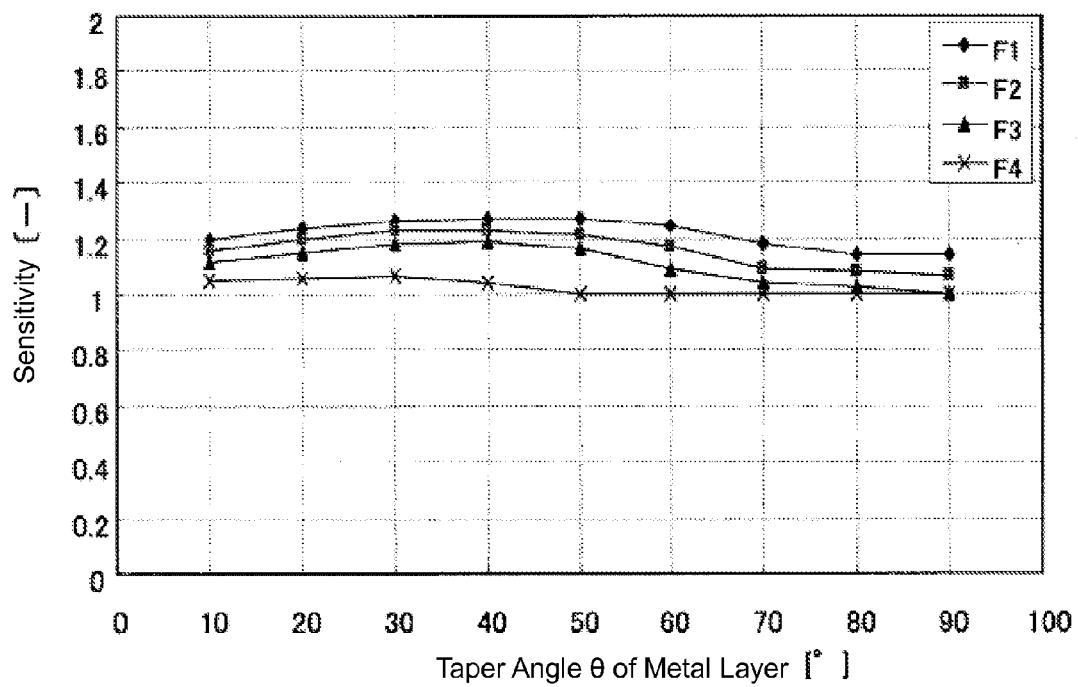
Figure 7:
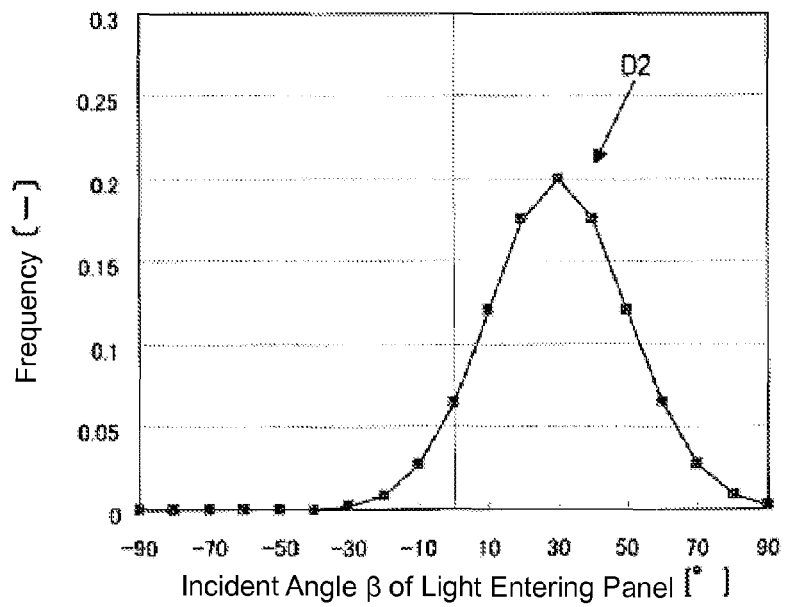
FIG. 7(*a*) is a graph that shows a distribution of angles of incidence β in case 2.
Figure 7:
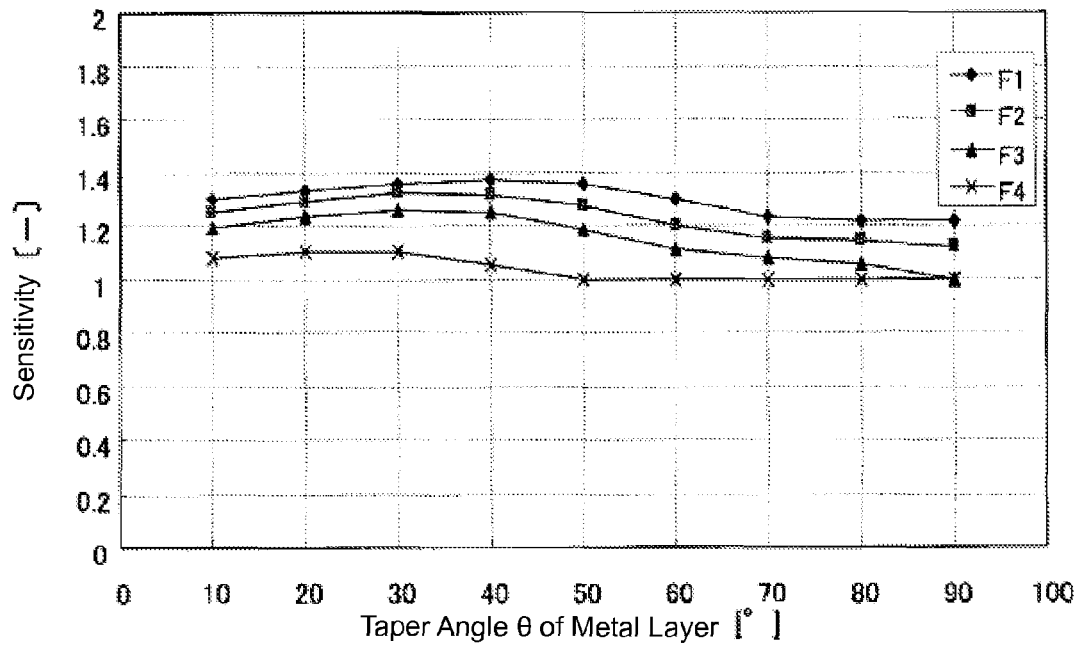
Figure 8:
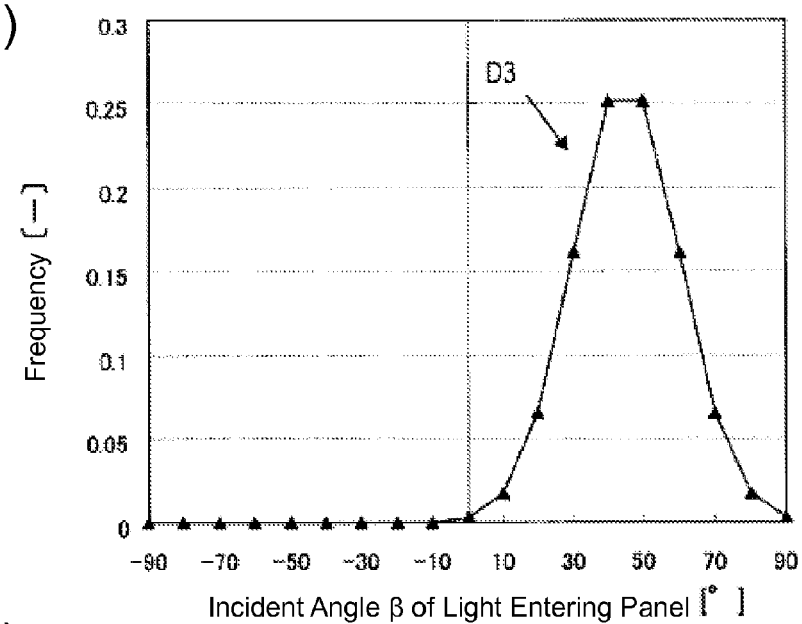
FIG. 8(*a*) is a graph that shows a distribution of angles of incidence β in case 3.
Figure 8:
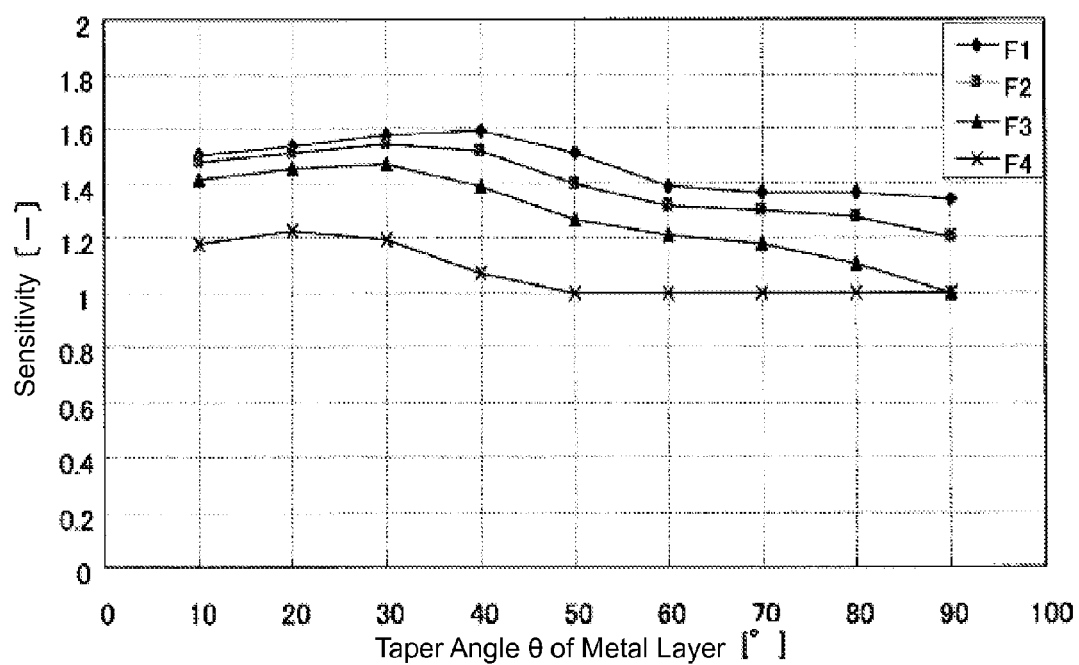

Here, a simulation was conducted concerning three cases with differing angle distributions (cases 1 to 3). The angle distributions D1 to D3 in the cases 1 to 3 are shown in FIGS. 6(a), 7(a), and 8(a), respectively. For the angle distribution D1, the average value of the angle of incidence β was set to 0° with a standard deviation σ of 30°. The distributions of angles of incidence β D2 and D3 show cases in which the angle distributions are towards the W direction, for example. For the distribution D2, the average value of the angles of incidence β was set to 30° with a standard deviation σ of 30°, while for D3 the average value of the angles of incidence β was set to 45° with a standard deviation σ of 15°.

In the simulation, it was assumed that only the light with the angle of incidence β being at least 0° and less than 90°, i.e., the light entering the panel from the vertical direction and the light entering from a direction inclined towards the metal layer 22a from the substrate normal line, enters the insulating film 17, and the light with the angle of incidence β being less than 0°, i.e., that light entering from a direction inclined towards the semiconductor layer side relative to the substrate normal line, would not enter the semiconductor layer 10. Therefore, the ratio of (1) is the ratio of the components that satisfy 0°≤β≤90°, out of the angle distributions D1, D2, and D3.

The ratio of (2) depends on the total reflection conditions (critical angle α) of the boundaries between the insulating film 17 and the films located above and below. In each case, an $SiO_2$ film with a refractive index of 1.46 was used as the insulating film 18 and the insulating film 2, and for the insulating film 17, four types of films F1 to F4 with different refractive indices "n" were used. The refractive index "n" for the film F1 was 3, the refractive index "n" for the film F2 was 2.5, the refractive index "n" for the film F3 (SiN film) was 2, and the refractive index "n" for the film F4 (SiNO film) was 1.67.

The ratio of (2) also depends on the boundary that light entering from the side face of the inclined part of the insulating film 17 first encounters (boundary between the insulating film 17 and the insulating film 18 or the boundary between the insulating film 17 and the metal layer M2), the angle of incidence of light to this boundary, or the like. This is determined by the taper angle θ of the metal layer M2, the angle of incidence β of light incident upon the panel, and the like. Also, in order for the light that fulfills the total reflection condition and is transmitted through the inclined part of the insulating film 17 to reach the side face of the semiconductor layer 10, the light must also fulfill the total reflection condition at the horizontal part of the insulating layer 17. Whether or not the light fulfills the total reflection condition depends on which boundary the light that is about to reach the horizontal part from the inclined part reflects off of, where on the boundary the light reflects off of, and the like. These similarly depend upon the taper angle θ of the metal layer M2 and the angle of incidence β of light incident upon the panel, and the like. In each case, the sensitivity was calculated for different taper angles θ for the metal layer M2 within a range of 10° to 90°.

For the absorbance of (3), the value described with reference to FIG. 5 was used. Specifically, in this example, light enters the semiconductor layer 10 from the side faces 3R and 3L, and thus, the proportion of light absorbed in the intrinsic region (absorbance) was set to 40%.

In this manner, in the simulation, the refractive index of the insulating film 17 and the taper angle θ of the metal layer M2 were each changed, and the sensitivity of the semiconductor layer 10 to infrared light was measured under these conditions. For the "sensitivity," the value was derived under the condition that the sensitivity was set to 1 for when the metal layer M2 was not disposed, or in other words, when light (infrared) only entered the semiconductor layer 10 from above. The calculation conditions for the cases 1 to 3 are shown in Table 1 and the sensitivity calculation results are shown in Table 2.

TABLE 1

| | Case 1 Calculation Condition | | | | Case 2 Calculation Condition | | | | Case 3 Calculation Condition | | | |
|---|---|---|---|---|---|---|---|---|---|---|---|---|
| | Distribution of Angles of incidence β | | | | | | | | | | | |
| | D1 (β ave: 0°, σ: 30°) | | | | D2 (β ave: 30°, σ: 20°) | | | | D3 (β ave: 45°, σ: 15°) | | | |
| | Type of Insulating Film 17 | | | | | | | | | | | |
| | F1 | F2 | F3 | F4 | F1 | F2 | F3 | F4 | F1 | F2 | F3 | F4 |
| Refractive Index n (—) | 3 | 2.5 | 2 | 1.67 | 3 | 2.5 | 2 | 1.67 | 3 | 2.5 | 2 | 1.67 |
| Critical Angle α (°) | 29.6 | 36.3 | 47.7 | 62.4 | 29.6 | 36.3 | 47.7 | 62.4 | 29.6 | 36.3 | 47.7 | 62.4 |
| Taper Angle θ (°) | 10 to 90 | | | | 10 to 90 | | | | 10 to 90 | | | |

TABLE 2

| | Case 1: Sensitivity (—) | | | | Case 2: Sensitivity (—) | | | | Case 3: Sensitivity (—) | | | |
|---|---|---|---|---|---|---|---|---|---|---|---|---|
| | Type of Insulating Film 17 | | | | | | | | | | | |
| Taper Angle | F1 | F2 | F3 | F4 | F1 | F2 | F3 | F4 | F1 | F2 | F3 | F4 |
| θ: 10° | 1.20 | 1.16 | 1.12 | 1.05 | 1.29 | 1.25 | 1.19 | 1.07 | 1.50 | 1.48 | 1.41 | 1.17 |
| θ: 20° | 1.24 | 1.19 | 1.15 | 1.06 | 1.33 | 1.29 | 1.23 | 1.10 | 1.54 | 1.51 | 1.45 | 1.23 |
| θ: 30° | 1.26 | 1.23 | 1.18 | 1.06 | 1.35 | 1.32 | 1.26 | 1.10 | 1.57 | 1.55 | 1.47 | 1.19 |
| θ: 40° | 1.27 | 1.23 | 1.19 | 1.04 | 1.37 | 1.32 | 1.25 | 1.05 | 1.59 | 1.52 | 1.39 | 1.07 |
| θ: 50° | 1.27 | 1.22 | 1.16 | 1.00 | 1.36 | 1.28 | 1.18 | 1.00 | 1.51 | 1.40 | 1.27 | 1.00 |
| θ: 60° | 1.25 | 1.17 | 1.09 | 1.00 | 1.30 | 1.20 | 1.11 | 1.00 | 1.39 | 1.32 | 1.21 | 1.00 |
| θ: 70° | 1.18 | 1.09 | 1.04 | 1.00 | 1.23 | 1.15 | 1.08 | 1.00 | 1.36 | 1.30 | 1.17 | 1.00 |
| θ: 80° | 1.14 | 1.08 | 1.03 | 1.00 | 1.22 | 1.14 | 1.05 | 1.00 | 1.36 | 1.27 | 1.10 | 1.00 |
| θ: 90° | 1.14 | 1.07 | 1.00 | 1.00 | 1.22 | 1.12 | 1.00 | 1.00 | 1.34 | 1.20 | 1.00 | 1.00 |

The results of calculating the sensitivity in cases 1 to 3 are respectively shown in FIGS. 6(b), 7(b), and 8(b). FIGS. 6(b), 7(b), and 8(b) are graphs that respectively show the relation between the taper angle θ and the refractive index "n" of the insulating film 17, and the sensitivity of the semiconductor layer 10, when the angles of incidence β have distributions D1, D2, and D3.

From these calculation results, it was found that the sensitivity can be reliably increased by disposing the metal layer M2 compared to when a metal layer is not disposed (conventional thin film diode). For example, if the distribution of the angles of incidence β is D3 (case 3), then if the film F3 (refractive index "n": 2) is used for the insulating film 17 and the taper angle θ is set to 30°, then the sensitivity can be increased by 1.47 times.

From the calculation results of the cases 1 to 3, it was found that the more components of light coming from the direction inclined towards the metal layer M2 side (β>0) are present in the light incident upon the panel, the higher the increase in sensitivity is.

In addition, it was found that if a film with a high refractive index "n" is used for the insulating film 17 without regard to the angle distribution, then the critical angle α becomes smaller, and thus, the sensitivity can be increased more effectively.

Also, when using the film F3 (refractive index "n": 2) as the insulating film 17, for example, in case 1, the degree of increase in sensitivity is the greatest when the taper angle θ is set to 40°, and in cases 2 and 3, the degree of increase in sensitivity is the greatest when the taper angle θ is set to 30°. In this manner, the taper angle θ is obtained by appropriately optimizing the angle according to the distribution of angles of incidence β for light entering the panel. Specifically, as the peak in the distribution of angles of incidence β for the light entering the panel increases from 0°, the optimal taper angle θ decreases.

Through a similar method to that mentioned above, it is possible to determine the degree of increase in sensitivity due to the inclined surface of the metal layer M1 in the cross-section along the L direction. Also, in the above-mentioned calculation, the sensitivity of the thin film diode was determined with a case in which the distribution of angles of incidence β leaned towards the W direction as an example, but even if the distribution of angles of incidence β leaned towards the W direction and the L direction, it is possible to calculate the sensitivity using a similar method to that mentioned above.

<Manufacturing Method for Semiconductor Device 1000>

Next, an example of a manufacturing method for the semiconductor device 1000 of the present embodiment will be described with reference to drawings.

FIGS. 9(a) to 9(d), 10(e) to 10(h), and 11(i) to 11(l) are process cross-sectional views for describing a manufacturing method of the semiconductor device 1000.

Figure 9:
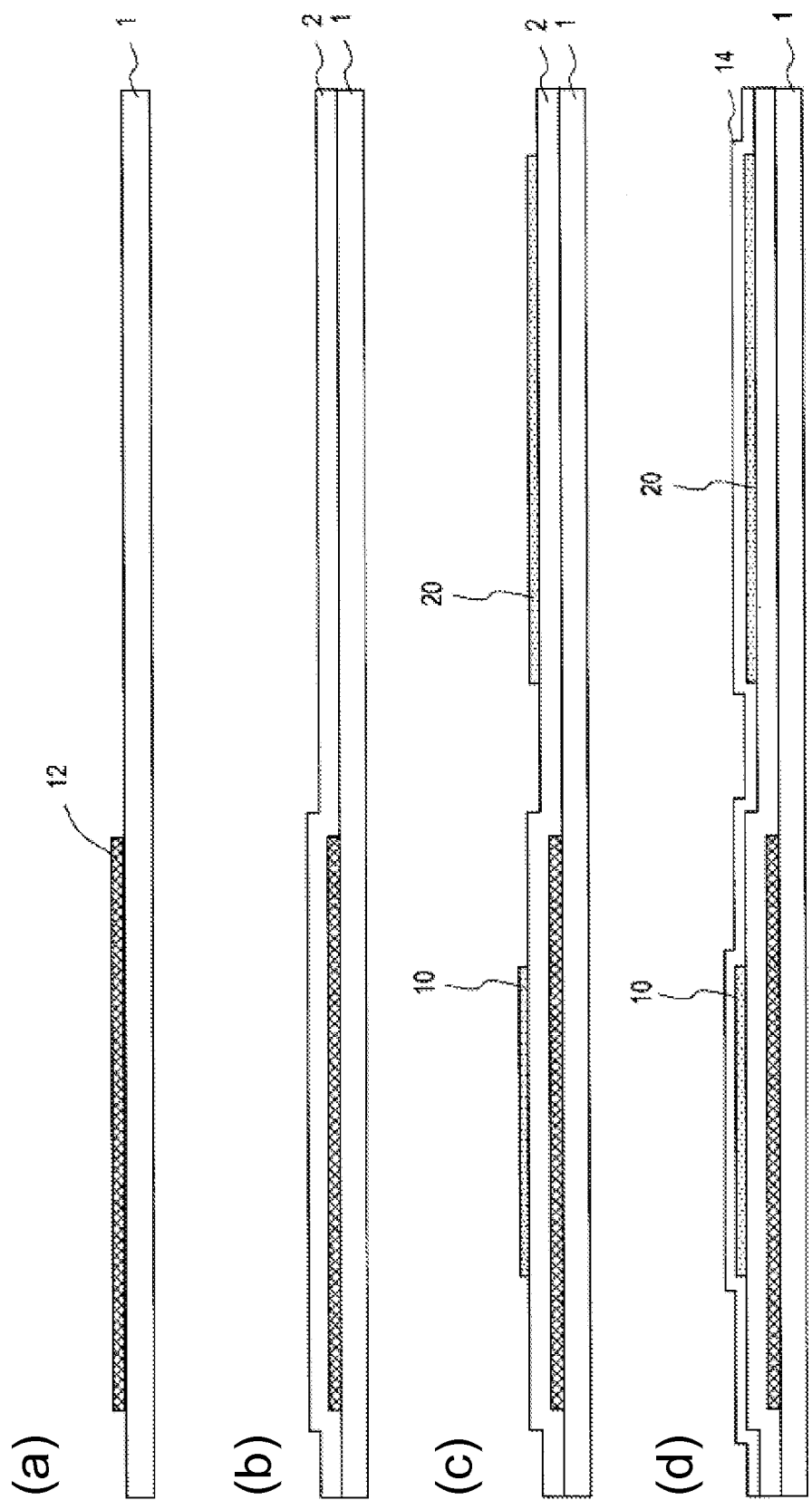
FIGS. 9(*a*) to 9(*d*) are schematic process cross-sectional views for describing the manufacturing method of the semiconductor device of Embodiment 1 of the present invention.

First, as shown in FIG. 9(a), a light-shielding layer 12 is formed in a region of the substrate 1 surface where the TFD is to be formed. For the substrate 1, a low alkali glass substrate or a quartz substrate can be used. The light-shielding layer 12 is disposed so as to block light coming from the rear side of the substrate towards the TFD. A metal film, a silicon film, or the like can be used as a material for the light-shielding layer 12. If a metal film is used, it is preferable that a metal with a high melting point such as tantalum (Ta), tungsten (W), or molybdenum (Mo) is used, taking into consideration the heat treatment to take place in a later manufacturing step. The thickness of the light-shielding layer 12 needs to be set to block not only visible light, but also infrared light to a sufficient degree, and the thickness thereof is 50 to 300 nm, for example, and preferably 100 to 200 nm.

Next, as shown in FIG. 9(b), an insulating film 2 is formed as a base coat film on the substrate 1 and the light-shielding layer 12.

Next, as shown in FIG. 9(c), a semiconductor layer 10 to become a TFD active region (n+ type/p+ type regions, intrinsic region), and a semiconductor layer 20 to become a TFT active region (source region, drain region, channel region) are formed on the insulating film 2. Specifically, first, an amorphous semiconductor film (a-Si film in this case) is formed on the insulating film 2, and is crystallized to form a crystalline semiconductor film (poly-Si film). Then, patterning is conducted on the poly-Si film by photolithography, thus forming the semiconductor layers 10 and 20.

Known methods such as the plasma CVD method or the sputtering method are used in order to form the a-Si film. The a-Si film has a thickness of between 20 nm and 150 nm inclusive, and preferably between 30 nm and 80 nm inclusive. In the present embodiment, an a-Si film with a thickness of 50 nm is formed by the plasma CVD method. Also, it is possible to form the insulating film 2 and the a-Si film by the same film-forming method, and thus, both may be formed continuously.

The crystallization method is not limited, but crystallization may be conducted by adding a catalyst element that promotes crystallization to the a-Si film and then conducting heat treatment, for example.

The addition of the catalyst element is conducted by spin-coating the a-Si film with an aqueous solution including a catalyst element (nickel) (nickel acetate aqueous solution) with a weight conversion of approximately 1 to 10 ppm; 5 ppm, for example. Aside from nickel (Ni), one or a plurality of types of elements out of a group constituted of iron (Fe), cobalt (Co), tin (Sn), lead (Pb), palladium (Pd), and copper (Cu) may be used as the catalyst element(s). Ruthenium (Ru), rhodium (Rh), osmium (Os), iridium (Ir), platinum (Pt), gold (Au), and the like also function as catalyst elements although the catalytic effect thereof is smaller than the previously mentioned group. Very small amounts of the catalyst element are used for doping; the concentration of catalyst elements on the surface of the a-Si film is controlled by the total reflection x-ray fluorescence (TRXRF) method. In the present embodiment, the concentration is approximately $5 \times 10^{12}$ atoms/cm$^2$.

The addition of the catalyst element may be conducted by forming a thin film of the catalyst element (a nickel film in the present embodiment) on the a-Si film by the vapor deposition method or the sputtering method instead of the spin-coat method.

The heat treatment of the a-Si film to which the catalyst element is added can be conducted under an inert atmosphere such as a nitrogen atmosphere. For the heat treatment, it is preferable that annealing is conducted for 30 minutes to 4 hours at a temperature of 500 to 650° C. In the present embodiment, the heat treatment is conducted for 1 hour at 600° C. As a result, the nickel spreads throughout the a-Si film and silicidation occurs therein, and crystallization of the a-Si film occurs with the silicides as the nuclei. As a result, the a-Si film is crystallized and becomes a poly-Si film. A rapid thermal annealing (RTA) device that uses a lamp or the like as a heat source may be used to conduct crystallization instead of heat treatment that uses a furnace.

Next, as shown in FIG. 9(d), the gate insulating film 14 that covers the semiconductor layers 10 and 20 is formed. It is preferable that a silicon oxide film with a thickness of 20 to 150 nm be used for the gate insulating film 14, and in this case, a 100 nm silicon oxide film is used.

Figure 10:
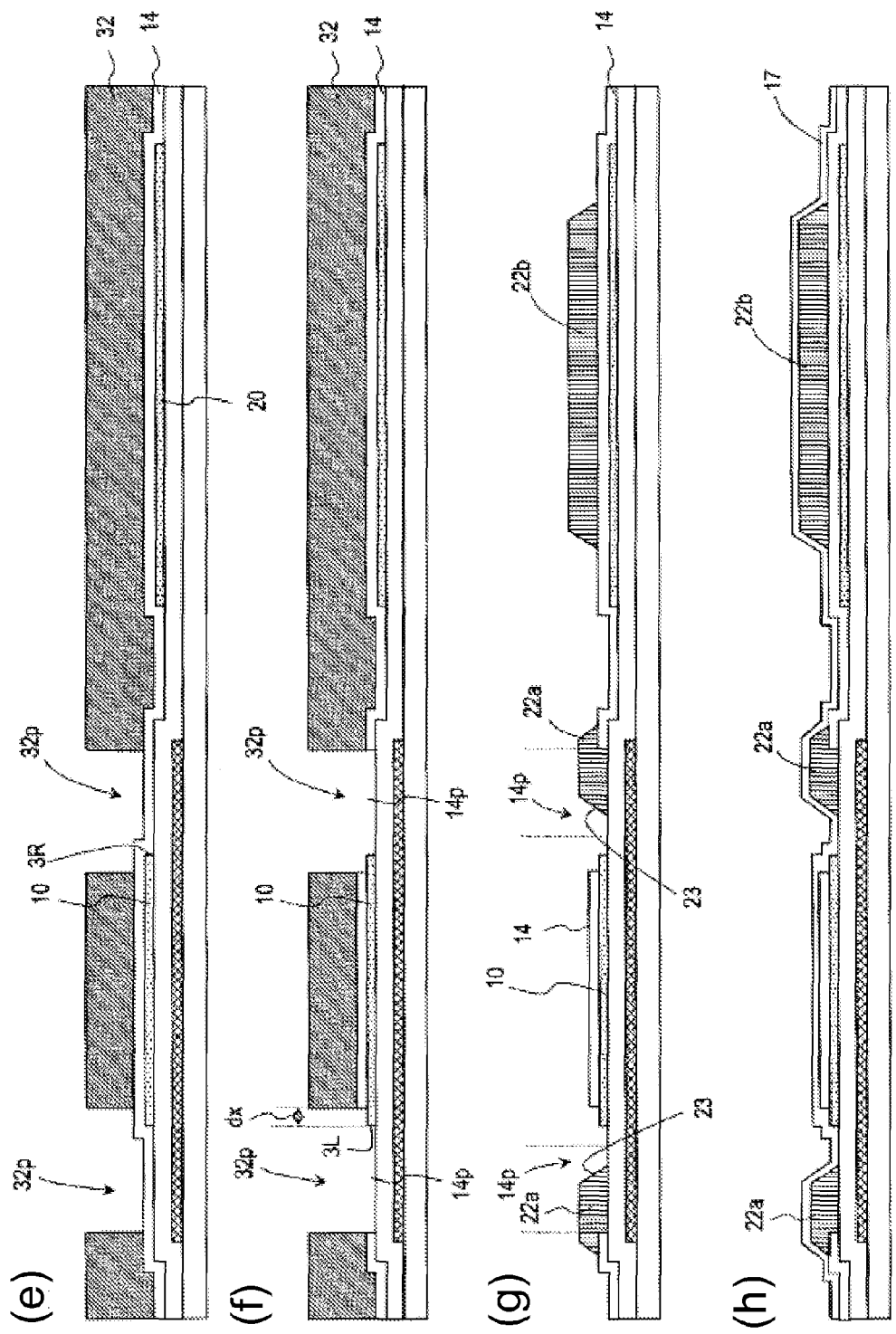
FIGS. 10(*e*) to 10(*h*) are schematic process cross-sectional views for describing the manufacturing method of the semiconductor device of Embodiment 1 of the present invention.

Then, as shown in FIG. 10(e), a resist film 32 is formed on the gate insulating film 14, and openings 32p are formed in parts of the resist film located in the vicinity of the sides of the semiconductor layer 10. The respective openings 32p may be rectangles that extend along the side faces 3R and 3L when the substrate 1 is viewed from above. Here, the openings 32p are respectively disposed above the part of the periphery of the semiconductor layer 10 along the side faces 3R and 3L.

Next, as shown in FIG. 10(f), parts of the gate insulating film 14, which are exposed by the openings 32p of the resist film 32, are removed. As a result, openings 14p are formed in the gate insulating film 14. It is preferable that the gate insulating film not remain on the side faces 3R and 3L of the semiconductor layer 10 at this time. With this configuration, it is possible for light guided by the insulating film 17 to be made incident on the side faces 3R and 3L more effectively than when the side faces 3R and 3L of the semiconductor layer 10 are covered by the gate insulating film, thus reducing the loss of light.

In the present embodiment, the parts of the periphery part of the semiconductor layer 10 along the side faces 3R and 3L are not covered by the gate insulating film 14 when the substrate 1 is viewed from above. A distance dx from the side faces 3R and 3L to the edge of the gate insulating film 14 is between 1 μm and 2 μm inclusive, for example.

After the resist film 32 is removed, as shown in FIG. 10(g), the metal layers 22a are formed in the openings 14p of the gate insulating film 14, and in the region in the semiconductor layer 20 where the channel region is to be formed, the gate electrode 22b is formed. The metal layers 22a and the gate electrode 22b are formed by using the sputtering method, the CVD method, or the like in order to deposit a conductive film on the gate insulating film 14 and patterning the conductive film. Patterning can be conducting by photolithography. At this time, patterning is conducted such that at least the part 23, which faces the side face of the semiconductor layer 10, of the side face of the metal layer 22a has an inclined part relative to the substrate 1. In order to increase the coatability of the film formed on the metal layers 22a and the gate electrode 22b, it is preferable that the side faces of the metal layers 22a and the gate electrode 22b all have tapering. It is preferable that a metal with a high melting point such as W, Ta, Ti, Mo, or an alloy thereof be used for the conductive film. Also, it is preferable that the thickness of the conductive film be between 300 nm and 600 nm inclusive.

Then, although not shown in drawings, impurity ion implantation is conducted on the semiconductor layers 10 and 20, and a p-type region and an n-type region are formed in the semiconductor layer 10 and a source region and a drain region are formed in the semiconductor layer 20. An annealing step is conducted in order to activate the implanted impurity ions. In the annealing step, the catalyst element (Ni) included in the channel region of the semiconductor layer 10 moves towards the source region and the drain region, and the catalyst element included in the intrinsic region of the semiconductor layer 20 moves towards the n-type region (gettering). As a result, it is possible to make the Ni concentration in the channel region lower than the Ni concentration in the source region and drain region. Also, the Ni concentration in the intrinsic region can be made lower than that of the n-type region.

Next, as shown in FIG. 10(h), the insulating film 17 is formed so as to cover the metal layer 22a, the gate electrode 22b, and the gate insulating film 14. Here, a silicon nitride film (SiN film) is used as the insulating film 17. It is preferable that the insulating film 17 have a higher refractive index than the films disposed above and below the insulating film 17 (the gate insulating film 14 and the insulating film 18, which will be mentioned below). With this configuration, it is possible to have the insulating film 17 function more effectively as a waveguide layer that guides light incident upon the inclined surface 23 of the metal layer 22a to the vicinity of the side face of the semiconductor layer 10.

It is possible to conduct the impurity ion implantation step mentioned above after forming the insulating film 17. In such a case, the impurity ions are implanted in the semiconductor layers 10 and 20 through the insulating film 17 (through-doping).

Figure 11:
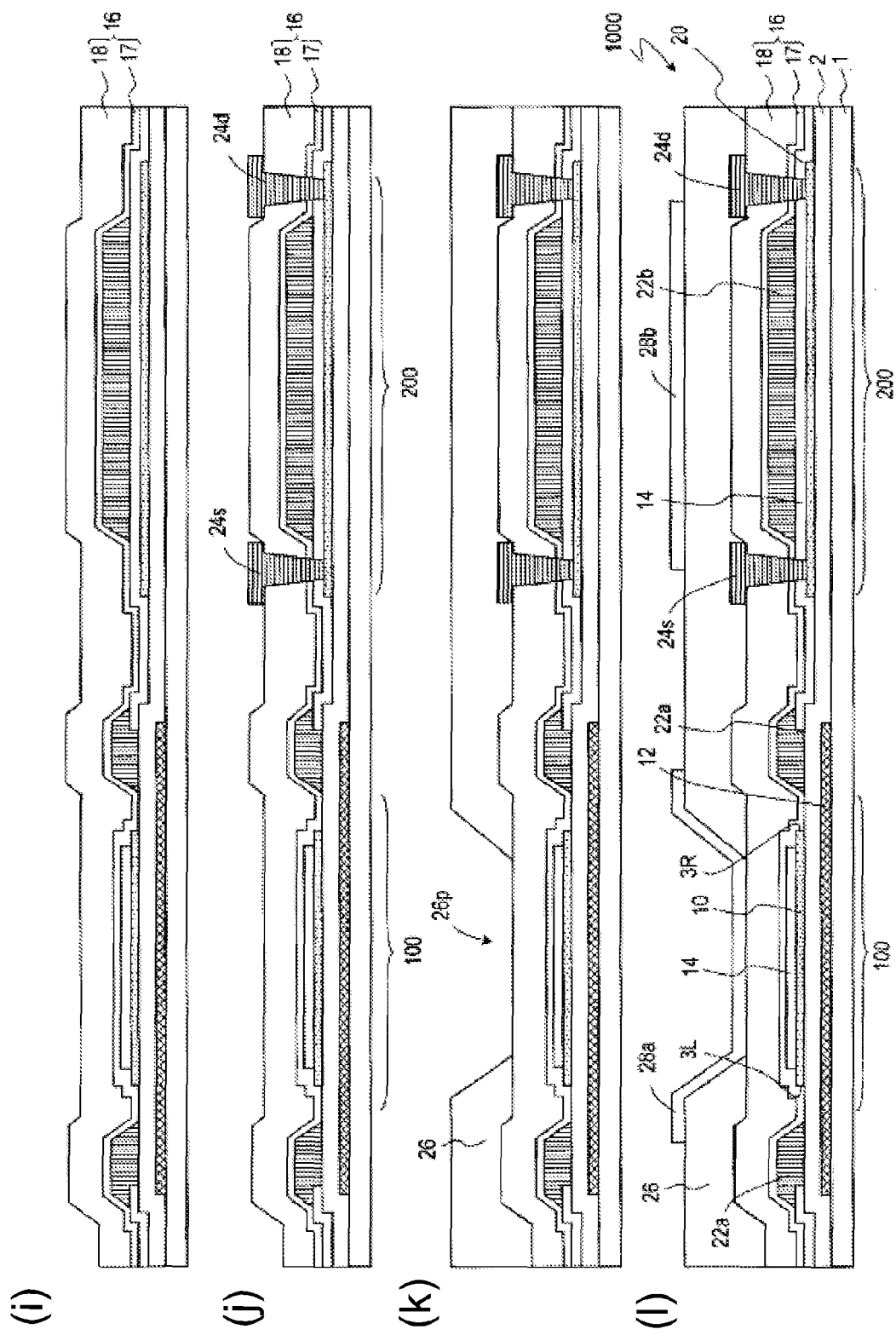
FIGS. 11(*i*) to 11(*l*) are schematic process cross-sectional views for describing the manufacturing method of the semiconductor device of Embodiment 1 of the present invention.

Next, as shown in FIG. 11(i), the insulating film 18 is formed on the insulating film 17. Here, a silicon oxide film ($SiO_2$ film) is used for the insulating film 18. In the present specification, the insulating films 17 and 18 are collectively referred to as the "interlayer insulating film 16."

Then, as shown in FIG. 11(j), contact holes are formed in the interlayer insulating film 16. Next, a film made of a metal material is deposited on the interlayer insulating film 16 and inside the contact holes, and by patterning the film, electrodes and wiring lines including the TFT source electrode 24s, the drain electrode 24d, and a TFD electrode (not shown in drawing) are formed. As a result, a thin film diode 100 and a thin film transistor 200 are formed.

As shown in FIG. 11(k), the protective film 26 made of a transparent resin, for example, may be provided on the thin film transistor 200 and the thin film diode 100. It is preferable that the part of the protective film 26 located above the semiconductor layer 10 (at least the part of the protective film 26 located above the region of the semiconductor layer 10 to become intrinsic region) be provided with an opening 26p. With this configuration, light traveling towards the semiconductor layer 10 from above the substrate 1 can be prevented from being absorbed by the protective film 26 or reflected at the boundary between the protective film 26 and the interlayer insulating film 16. Also, changes in device properties due to changes in electrical properties of the protective film 26 over time can be prevented.

Then, as shown in FIG. 11(l), a shield electrode 28a and a pixel electrode 28b made of a transparent conductive film may be formed on the protective film 26.

In the above-mentioned method, crystallization of the amorphous semiconductor film is conducted using a catalyst element, but laser crystallization may be used instead. It is also possible to further increase the crystalline properties of the semiconductor film by radiating a laser thereon after conducting crystallization using a catalyst element.

When forming the semiconductor layer 10 using a semiconductor film crystallized using a catalyst element, at least the channel region is mainly constituted of crystals of the <111> zone. Also, 50% or more of the region of the semiconductor layer defined by the <111> zone has the (110) or (211) plane orientation. In addition, the size (domain diameter) of individual crystal domains (substantially the same plane direction region) is between 2 μm and 10 μm inclusive, for example. The plane orientation, the ratio of the plane orientation, and the domain diameter of the crystal domain were measured by the EBSP method.

In the present embodiment, light entering from the front surface of the display panel passes through a plurality of films, and reaches the intrinsic region of the semiconductor layer 10 and the inclined surface 23 of the metal layer 22a. There is a risk that at this time the light is totally reflected at the boundary between these films (referred to as "upper layer films"), and the amount of light incident upon the inclined surface 23 is reduced. It is preferable that the material for each upper layer film be selected such that total reflection is mitigated even in such a configuration.

One example of a combination of materials for each upper layer film formed above the semiconductor layer 10 will be described with reference to FIG. 12. In this example, Mo (molybdenum) is used for the light-shielding layer 12, a laminated film constituted of an SiNO film (lower layer) and an $SiO_2$ film (upper layer) is used for the insulating film (base coat film) 2, an $SiO_2$ film is used for the gate insulating film 14, an SiN film is used for the insulating film 17, which is the lower layer of the interlayer insulating film 16, an $SiO_2$ film is used for the insulating film 18, which is the upper layer of the interlayer insulating film 16, and an ITO (indium tin oxide) film is used for the shield electrode 28a.

The complex refractive index N for each material is represented by n−ik (n: refractive index, k: extinction coefficient). "n" and "k" have wavelength dispersion. The "n" and "k" of each material to infrared light with a wavelength of 850 nm, and the thickness d of each material is shown in Table 3.

Table 3 shows that in the upper portion of the semiconductor layer 10, there is almost no absorption of light by the upper layer films (k≈0). The "n" of each layer is configured so as to increase in order from the top for each lower layer, thus minimizing total reflection. However, while the "n" of the third layer (insulating film 17) is greater than the "n" of the fourth layer (gate insulating film 14), this is in order to reduce the loss of light transmitted through the insulating film 17, which is a waveguide layer as described above. In the configuration shown in FIG. 1, the gate insulating film 14 is removed from the inclined surface 23 of the metal layer 22a, and thus, a boundary does not exist. Therefore, light can enter the inclined surface 23 efficiently.

TABLE 3

| Upper Layer Film | Refractive Index n | Extinction Coefficient k | Film Thickness d (nm) |
|---|---|---|---|
| Air | 1.00 | 0.00 | — |
| First Layer: Electrode 28b (ITO) | 1.36 | 0.07 | 100 |
| Second Layer: Insulating Film 18 ($SiO_2$) | 1.46 | 0.00 | 600 |
| Third Layer: Insulating film 17 (SiN) | 2.00 | 0.00 | 100 |
| Fourth Layer: Gate Insulating Film 14 ($SiO_2$) | 1.46 | 0.00 | 100 |
| Fifth Layer: Semiconductor Layer 10 (Si) | 3.66 | 0.00 | 50 |
| Sixth Layer: Insulating Film 2 ($SiO_2$) | 1.46 | 0.00 | 100 |
| Seventh Layer: Insulating Film 2 (SiNO) | 1.67 | 0.00 | 100 |
| Eighth Layer: Light-Shielding Layer 12 (Mo) | 3.39 | 3.34 | 150 |
| Ninth Layer: Substrate 1 (Glass Substrate) | 1.46 | 0.00 | 700000 |

Figure 12:
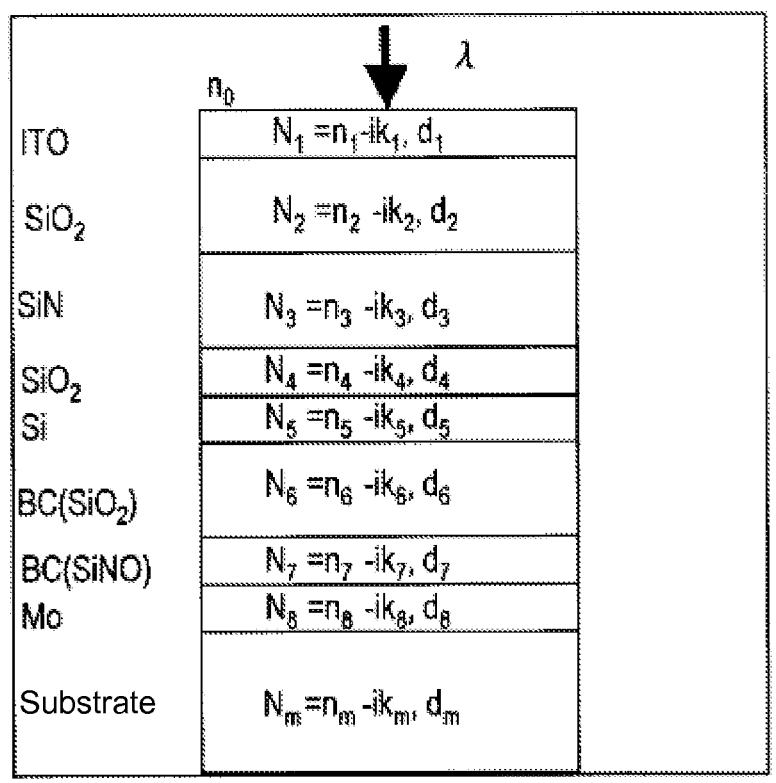
FIG. 12 is a drawing that shows one example of a combination of materials of each upper layer film formed above the semiconductor layer 10.

Above the inclined surface 23 of the metal layer 22a, the protective film 26 is formed between the shield electrode 28a and the insulating film 18, in addition to the upper layer films shown in FIG. 12. For the protective film 26, a positive-type photosensitive resin film is used, for example. In order to allow light to enter the semiconductor layer 10 efficiently from above the substrate 1, not only may the part of the protective film 26 located above the semiconductor layer 10 be removed, but also the part located above the inclined surface 23 may be removed.

In the display region of the semiconductor device (display device) 1000, a photosensor part that includes the thin film diode 100 may be disposed for each pixel or for each set of pixels constituted of a plurality of pixels. The photosensor part may include a plurality of photosensor TFDs that include thin film diodes 100.

(Embodiment 2)

The present embodiment describes a display device provided with a sensor function.

The display device provided with a sensor function of the present embodiment is a liquid crystal display device with a touch sensor, for example, and has a display region and a frame region located in the periphery of the display region. The display region has a plurality of display parts (pixels) and a plurality of photosensor parts. Each display part includes a pixel electrode and a pixel switching TFT, and each photosensor part includes a photosensor TFD that detects light that includes infrared light (wavelength: 850 nm), for example. The frame region is provided with a display driver circuit for driving each display part, and a driver circuit TFT is used for the driver circuit. The pixel switching TFT, the driver circuit TFT, and the photosensor part TFD are formed on the same substrate. In the display device of the present invention, at least one of the TFTs used in the display device needs to be made of the same semiconductor film as the photosensor TFD and formed on the same substrate. Therefore, the driver circuit may be provided separately on a different substrate.

In the present embodiment, the photosensor part is disposed adjacent to the corresponding display part (a primary color sub-pixel, for example). One photosensor part may be provided per display part, or a plurality of photosensors may be provided per display part. Alternatively, one photosensor part may be disposed per set of a plurality of display parts. For example, it is possible to provide one photosensor part per color display pixel constituted of the three primary color sub-pixels (RGB). In this manner, it is possible to appropriately select the number of photosensor parts per display part (density) depending on the resolution.

The photosensor part preferably conducts sensing using infrared light. If visible light is used, the light is absorbed by pixels that display black, and thus, there is a possibility that high resolution sensing is difficult in this case. On the other hand, if infrared light is used, stable and high quality sensing properties that do not depend on the display can be realized. When using infrared light, the color filter disposed facing the viewer side of the photosensor part preferably has a filter function that cuts out visible light wavelength components in the light.

In the present embodiment, the backlight always emits infrared light without regard to the external light brightness or the displayed image. With this configuration, it is possible to detect infrared light emitted from the backlight and reflected off of an object that is in contact or close to the display surface (finger pad or the like). For example, in a part where a finger is in contact with the display surface (contacted part), the amount of light entering the photosensor TFD is greater than in a part where a finger is not in contact (non-contacted part). As a result, it is possible to detect the contacted part.

External light may be used in addition to infrared light. In such a case, it is possible to use the backlight only when the external light brightness is low.

The configuration of the display device of the present embodiment will be described with a touch panel liquid crystal display device provided with a touch panel sensor as an example, with reference to drawings.

Figure 13:
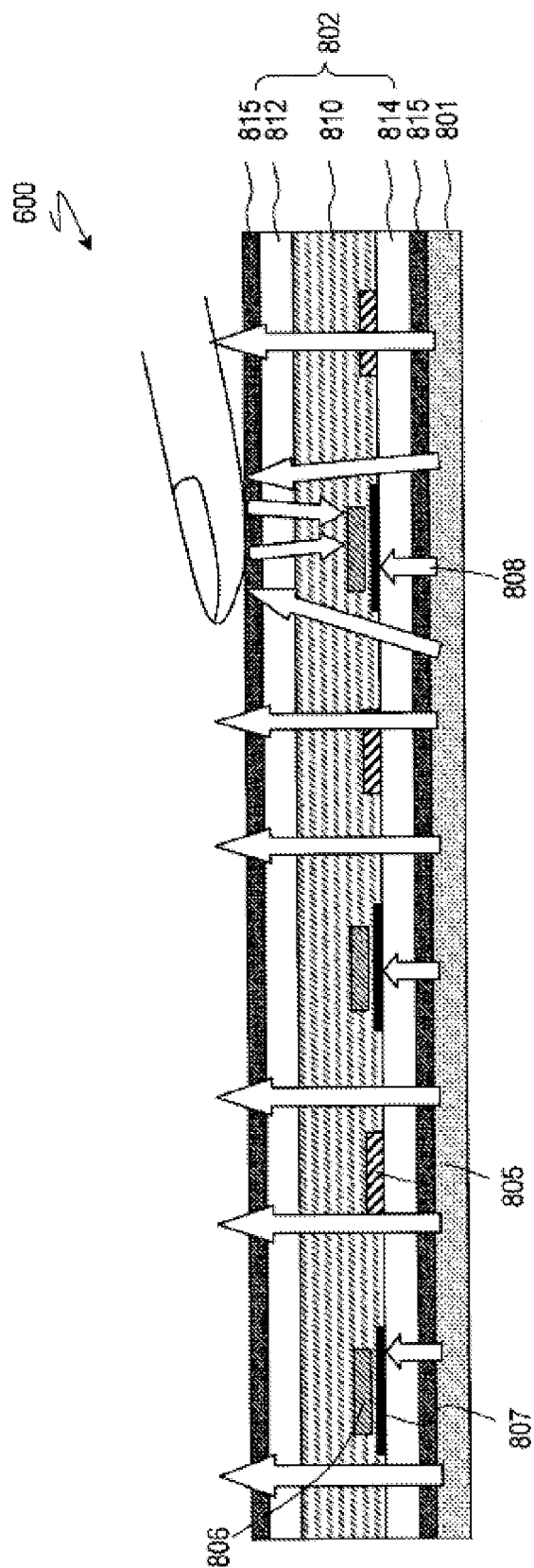
FIG. 13 is a drawing of a configuration of an optical sensor-type touch panel of Embodiment 2 according to the present invention.

FIG. 13 is a schematic cross-sectional view that shows one example of an active matrix touch panel liquid crystal display device.

The liquid crystal display device 600 is provided with a liquid crystal module 802 and a backlight 801 disposed on the rear surface side of the liquid crystal module 802. The liquid crystal module 802 is constituted of a transparent rear surface substrate 814, a front surface substrate 812 disposed facing the rear surface substrate, and a liquid crystal layer 810 interposed therebetween. The viewer side and the rear surface side of the liquid crystal module 802 are each provided with a polarizing plate 815.

The liquid crystal module 802 has a plurality of display parts (primary color sub-pixels), and each display part has a pixel electrode (not shown in drawings) and a pixel switching thin film transistor 805, which is connected to the pixel electrode. Also, a photosensor part including a thin film diode 806 is disposed adjacent to each color display pixel constituted of the three primary color (RGB) display parts. Alternatively, one photosensor part may be disposed for two adjacent color display pixels (six display parts).

Each display part is provided with a color filter (not shown in drawings) on the viewer side, but a color filter is not provided on the viewer side of the photosensor part.

When conducting photosensing using infrared light, a visible light cut filter may be provided on the viewer side of the photosensor part. A light-shielding layer 807 is interposed between the thin film diode 806 and the backlight 801. Therefore, light 808 from the backlight 801 is blocked by the light-shielding layer 807 and does not enter the thin film diode 806 from the rear surface (from the side of the rear surface substrate 814). The light-shielding layer 807 needs only to be disposed so as to block light from the backlight 801 from entering the intrinsic region of the thin film diode 806.

The photosensor part conducts sensing of light (infrared light) 808 from the backlight 801 that passes through the liquid crystal module 802 and is then reflected by a finger pad or the like.

Figure 14:
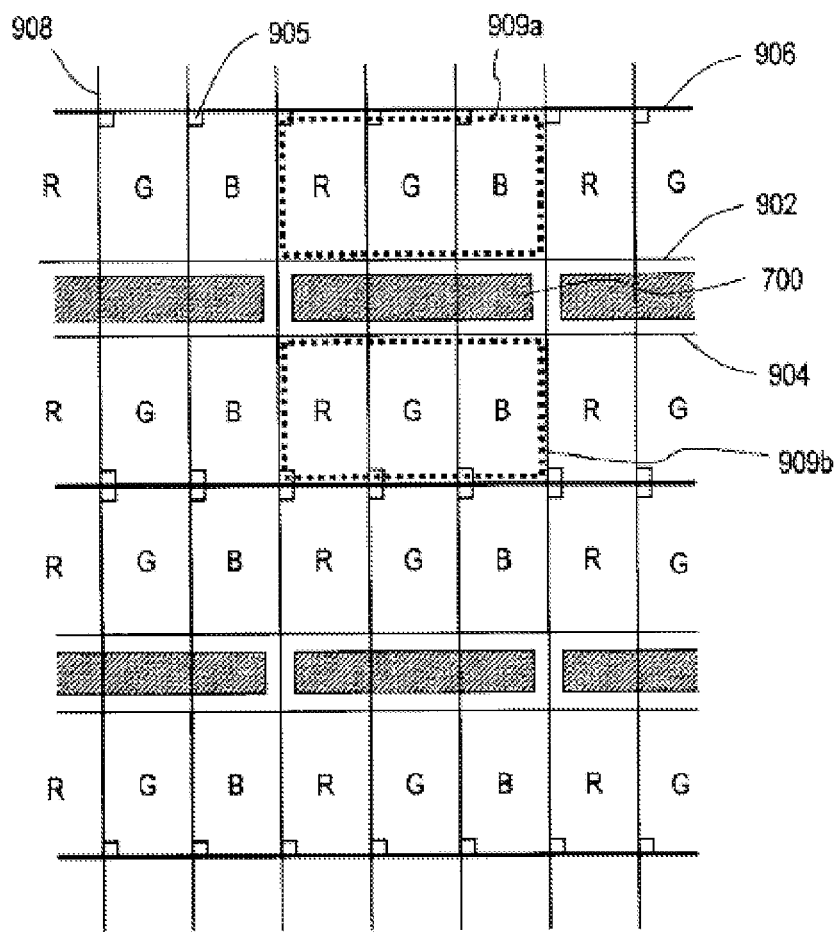
FIG. 14 is a schematic plan view that shows an example of a rear substrate in a touch panel-type liquid crystal display device of Embodiment 2 of the present invention.

FIG. 14 is a schematic plan view that shows a rear substrate of the display device of the present embodiment. In the example shown in the drawing, one photosensor part is provided for every two color pixels constituted of R, G, and B sub-pixels.

The rear substrate of the present embodiment is provided with a plurality of R, G, and B sub-pixels arranged in a matrix, and a plurality of photosensor parts 700. Each pixel has a pixel switching thin film transistor 905 and a pixel electrode (not shown in drawings). Here, each set of pixels 909a, 909b constituted of adjacent R, G, and B sub-pixels is referred to as a "color display pixel." In the present embodiment, one photosensor part 700 is disposed for the two adjacent color display pixels 909a and 909b.

The thin film transistor 905 has a dual gate LDD configuration that has two gate electrodes and an LDD region, for example. A source region of the thin film transistor 905 is connected to a pixel source bus line 908 and the drain region is connected to the pixel electrode. The thin film transistor 905 is turned on or off based on signals from a pixel gate bus line 906. With this configuration, a voltage is applied to the liquid crystal layer as a result of pixel electrodes and an opposite electrode formed on the front surface substrate disposed facing the rear surface substrate, and display is conducted by changing the orientation of the liquid crystal layer.

In the present embodiment, an RST signal line 902 and an RWS signal line 904 are provided between the two adjacent gate wiring lines 906. The lines 902 and 904 are formed of the same layer as the gate wiring line 906. The photosensor part 700 is interposed between the lines 902 and 904.

Figure 15:
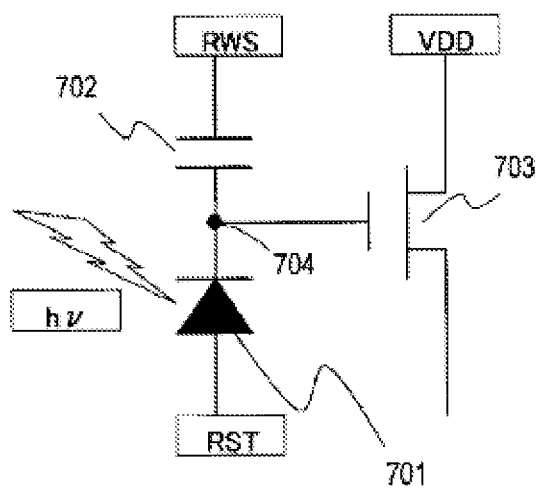
FIG. 15 is a circuit diagram that shows an example of a configuration of a photosensor part of Embodiment 2 of the present invention.
Figure 16:
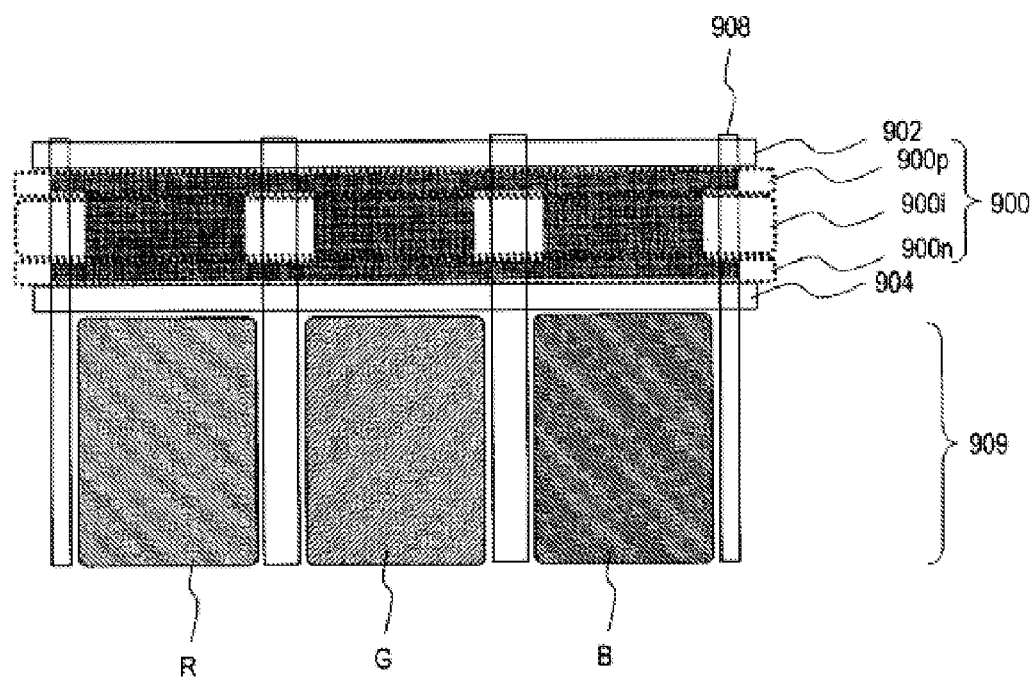
FIG. 16 is a plan view that shows an example of a configuration of a photosensor part of Embodiment 2 of the present invention.

FIGS. 15 and 16 are a circuit diagram and a plan view that respectively show a configuration of the photosensor part of the present embodiment.

The photosensor part 700 has a thin film diode 701, a signal-holding capacitor 702, and a signal retrieval thin film transistor 703. Each thin film diode 701 and each thin film transistor 703 are disposed in a region defined by the source bus lines 908, the RWS signal line 904, and the RST signal line 902.

The thin film diode 701 has a configuration similar to the thin film diode 100 shown in FIG. 1. A semiconductor layer 900 of the thin film diode 701 includes a p-type region 900p, an n-type region 900n, and an intrinsic region 900i interposed therebetween. An opening is formed in the part of the intrinsic region 900i of the semiconductor layer 900 that overlaps the source bus line 908, such that an insulating film (protective film), which needs to be provided between the source bus line 908 and the shield electrode (ITO film) thereon, is not formed above the intrinsic region 900i.

In this example, the RST signal line 902 and the RWS signal line 904 are each disposed so as to face the side faces of the p-type region 900p and the n-type region 900n of the semiconductor layer of the thin film diode 701, and each also functions as the metal layer 22a shown in FIG. 1.

The signal-holding capacitor 702 is constituted of a gate electrode layer and a semiconductor layer as electrodes, and a capacitance thereof is formed by the gate insulating film.

The p-type region 900p in the thin film diode 701 is connected to the RST signal line 902, and the n-type region 900n is connected to a lower electrode (Si layer) in the signal-holding capacitor 702, and is also connected to the RWS signal line 904 via the capacitor 702. In addition, the n-type region 900n is connected to the gate electrode layer in the signal retrieval thin film transistor 703. The source region of the signal retrieval thin film transistor 703 is connected to a VDD signal line, and the drain region is connected to the output signal line. These signal lines are also used as source bus lines.

Next, the operation during photosensing by the photosensor part 700 will be described.

(I) First, an RST signal is input by the RST signal line 902. As a result, a positive voltage is applied to the p-type region side of the photosensor thin film diode 701 and the thin film diode 701 becomes forward biased, thus resulting in the charge in the capacitor 702 being discharged. Then, when the RST signal is turned off, the thin film diode 701 becomes reverse biased.

(II) If a photocurrent is generated in the thin film diode 701, the signal-holding capacitor 702 becomes charged via the thin film diode 701.

(III) As a result, the potential of the n-type region 900n drops, and the gate voltage applied to the signal retrieval thin film transistor 703 changes as a result of this change in potential.

(IV) A VDD signal is applied by the VDD signal line to the source side of the signal-retrieval thin film transistor 703. If the gate voltage changes as stated above, then the current flowing to the output signal line connected to the drain side also changes, which allows retrieval of this electrical signal from the output signal line.

Photosensing is made possible by repeating the operations of (I) to (IV) while conducting a scan.

The configuration of the rear surface substrate of the touch panel liquid crystal display device of the present embodiment is not limited to that described above.

FIG. 17(a) is a plan view that shows a configuration of another rear surface substrate of the present embodiment as an example. FIGS. 17(b) and 17(c) are cross-sectional views along the Y-Y' line and the X-X' line respectively of the rear surface substrate shown in FIG. 17(a). In FIGS. 17(b) and 17(c), components similar to those of FIG. 1 are assigned the same reference characters and descriptions thereof are omitted, for ease of description.

In this example, an opening is formed in the part of the semiconductor layer 900 of the thin film diode 701 that overlaps the source bus line 908. The opening is provided with a metal layer 910 using the same conductive film as the gate wiring line. The metal layer 910 is disposed below the source bus line 908, sandwiching an interlayer insulating film 16 therebetween. The metal layer 910 has a tapered part, and functions as the metal layer 22a shown in FIG. 1. The metal layer 910 may be in a floating state or be electrically connected to one of the RST signal line 902 and the RWS signal line 904.

Figure 17:
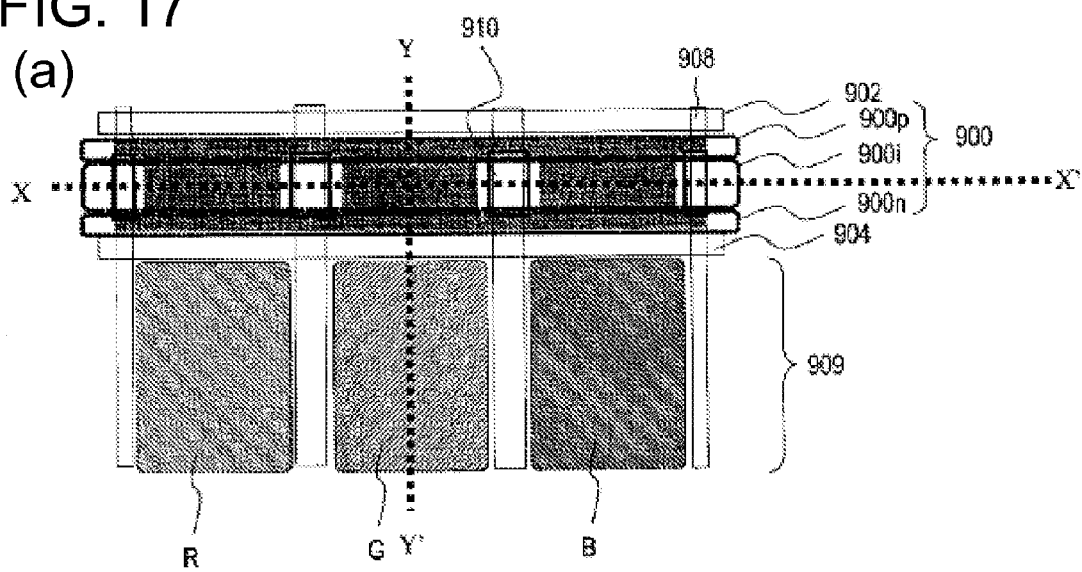
FIG. 17(a) is a plan view that shows an example of a configuration of another photosensor part of Embodiment 2 of the present invention.
FIGS. 17(b) and 17(c) are cross-sectional views of the photosensor part shown in FIG. 17(a).
Figure 17:
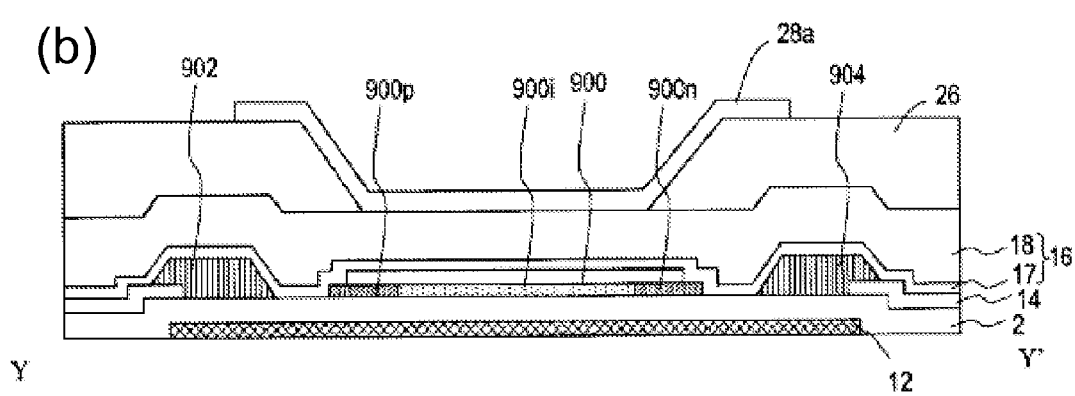
Figure 17:
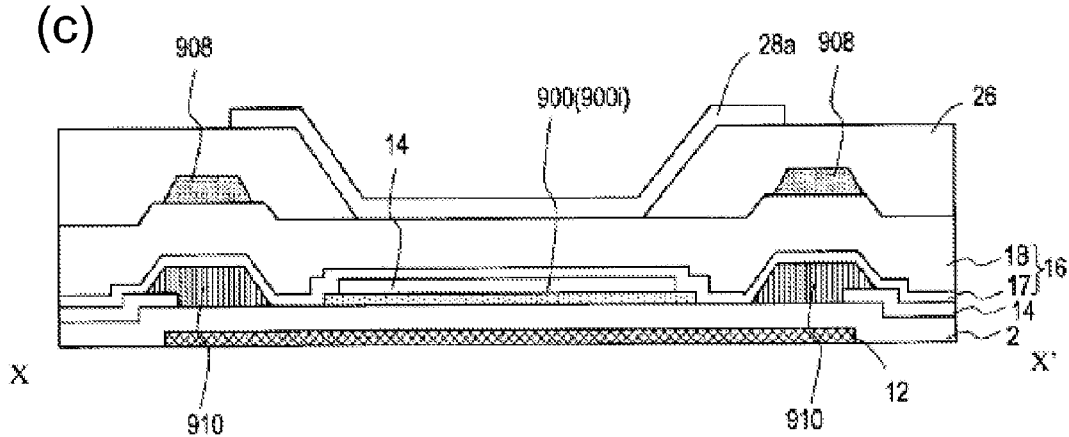

In the example shown in FIG. 17, not only are metal layers having inclined surfaces facing the side faces of the p-type region 900p and the n-type region 900n of the semiconductor layer provided, but a metal layer having an inclined surface facing the side face of the intrinsic region 900i is also provided. Therefore, it is possible to greatly increase the amount of light entering the semiconductor layer. Also, by disposing the metal layer 910 below the source bus line 908, it is possible to attain the above-mentioned effects without reducing the area of the light-receiving region.

In the present embodiment, one photosensor part is provided for every two color display pixels (a set of two pixels constituted of RGB sub-pixels), but one photosensor part may be disposed for every one color display pixel. Alternatively, it is possible to provide a photosensor part for each of RGB sub-pixels in order to further increase the resolution. However, in such a case, the aperture ratio greatly decreases, and thus, there is a possibility of the display brightness diminishing.

The semiconductor device of the present embodiment is not limited to a touch panel liquid crystal display device, and may be a display device equipped with an image sensor or a fingerprint sensor function. The above-mentioned photosensor part 700 can also be used as an image sensor or a fingerprint sensor. When using the photosensor part 700 as an image sensor or a fingerprint sensor, a higher resolution than a touch sensor is generally required in order to detect images or fingerprints pressed against the display surface. The resolution increases as the number of photosensors per pixel increases, and therefore, the number of photosensors may be appropriately adjusted depending on the application. For example, if one photosensor part is disposed for every two color display pixels, a resolution sufficient to allow images such as business cards to be read can be maintained. By additionally disposing a color filter on the viewer side of the photosensor part and having the photosensor part receive light that has been filtered by the color filter, it is possible to have the photosensor part function as a color image sensor.

A configuration of an image sensor to which the present invention has been applied will be briefly described below.

The image sensor is provided with a plurality of light-receiving elements arranged in two dimensions and an image data generating part that generates image data. Each light-receiving element may have a configuration similar to the pixel shown in FIG. 14. Alternatively, the light-receiving element may be constituted of three sub-pixels (RGB sub-pixels). Each light-receiving element includes the photosensor part 700 such as that described above. The image data generation part generates image data associated with the sensing signal generated by the photosensor part 700 of each light-receiving element and the position of each light-receiving element. With this configuration, images read in by the image sensor can be formed or recognized.

Industrial Applicability

The present invention can be applied as a semiconductor device provided with a photosensor part that uses a TFD, or a wide variety of electronic devices having such a semiconductor device. For example, the present invention may be applied to an active matrix liquid crystal display device or an organic EL display device. Such display devices can be used in the display surface of a mobile phone or a portable gaming device, the monitor of a digital camera, and the like, for example. Therefore, the present invention can be applied to all electronic devices equipped with a liquid crystal display device or an organic EL display device.

In particular, the present invention can be appropriately used for a display device such as an active matrix liquid crystal display device an organic EL display device, an image sensor, a photosensor, or an electronic device that combines these devices. The present invention is particularly suitable for a display device having a photosensor function that uses a TFD, such as a display device that combines a touch panel function and a scanner function.

DESCRIPTION OF REFERENCE CHARACTERS 1 substrate
2 insulating film
3R, 3L, 3P, 3N side face of semiconductor layer 10
10 TFD semiconductor layer
10i intrinsic region
10p p-type region
10n n-type region
14 gate insulating film
16 interlayer insulating film
17, 18 insulating film
20 TFT semiconductor layer
20s source region
20d drain region
20c channel region
22a metal layer
22b gate electrode
23 inclined surface
24s, 24d, 24n, 24p electrode (wiring line)
26 protective film
28a shield electrode
28b pixel electrode
100 thin film diode
200 thin film transistor
1000 semiconductor device

The invention claimed is:

1. A semiconductor device, comprising:
a substrate;
a thin film diode supported by the substrate and having a first semiconductor layer that includes a light-receiving region;
a thin film transistor supported by the substrate and having a second semiconductor layer; and
a metal layer having an inclined surface that is inclined relative to a surface of the substrate,
wherein the thin film diode can detect light of a prescribed wavelength incident upon the light-receiving region, wherein the first semiconductor layer and the second semiconductor layer are formed of a same semiconductor film, wherein the first semiconductor layer is laterally separated from the metal layer in a plan view, and at least a portion of a side face of the first semiconductor layer faces the inclined surface of the metal layer in a direction parallel to the surface of the substrate so that at least a portion of the light incident from above upon the inclined surface is reflected towards said side face of the first semiconductor layer, and wherein the semiconductor device further comprises:

a first insulating film formed between and being in contact with the side face of the first semiconductor layer and the inclined surface of the metal layer; and a pair of second insulating films formed so as to be in contact with an upper surface and a lower surface, respectively, of said first insulating film between the side face of the first semiconductor layer and the inclined surface of the metal layer, wherein the refractive index of each of the second insulating films to the light of the prescribed wavelength is lower than the refractive index of said first insulating film to the light of the prescribed wavelength.

2. The semiconductor device according to claim 1, wherein the thickness of said first insulating film is at least ½ and at most 2 times as thick as the first semiconductor layer.

3. The semiconductor device according to claim 1, further comprising a pair of insulating films formed so as to be in contact with an upper surface and a lower surface, respectively, of the first semiconductor layer, wherein the refractive index of each of the pair of insulating films to the light of the prescribed wavelength is lower than the refractive index of the first semiconductor layer to the light of the prescribed wavelength.

4. The semiconductor device according to claim 1, wherein the thin film transistor further includes a gate insulating film that covers the second semiconductor layer, and a gate electrode provided on the gate insulating film, and wherein the metal layer is formed of the same film as the gate electrode.

5. The semiconductor device according to claim 4, wherein the gate insulating film is not formed between the inclined surface of the metal layer and the substrate.

6. The semiconductor device according to claim 4, wherein the part of the side face of the first semiconductor layer that faces the inclined surface of the metal layer is not covered by the gate insulating film.

7. The semiconductor device according to claim 1, wherein the first semiconductor layer has a p-type region, an n-type region, and an intrinsic region that is located between the p-type region and the n-type region and is to be the light-receiving region, and wherein at least portions of a side face of the p-type region and a side face of the n-type region face the inclined surface of the metal layer.

8. The semiconductor device according to claim 1, wherein the first semiconductor layer has a p-type region, an n-type region, and an intrinsic region that is formed between the p-type region and the n-type region and is to be the light-receiving region, and wherein at least a portion of the side face of the intrinsic region faces the inclined surface of the metal layer.

9. The semiconductor device according to claim 1, wherein the light of the prescribed wavelength includes infrared light.

10. The semiconductor device according to claim 1, further comprising a light-shielding layer formed between the thin film diode and the substrate.

11. The semiconductor device according to claim 1, wherein a reflectance of the metal layer to the light of the prescribed wavelength is at least 70%.

12. A display device, comprising:

the semiconductor device according to claim 1;

a plurality of pixels arranged in two dimensions; and a plurality of photosensor parts, wherein each of the plurality of photosensor parts includes the thin film diode, and is disposed corresponding to each of the plurality of pixels or a set constituted of two or more pixels, and wherein each of the plurality of pixels includes the thin film transistor.

13. The display device according to claim 12, further comprising a backlight that emits the light of the prescribed wavelength.

* * * * *